US008067516B2

(12) United States Patent
Iijima et al.

(10) Patent No.: US 8,067,516 B2
(45) Date of Patent: Nov. 29, 2011

(54) COPOLYMER FOR POSITIVE TYPE LITHOGRAPHY, POLYMERIZATION INITIATOR USED IN PRODUCTION OF SAID COPOLYMER, AND COMPOSITION FOR SEMICONDUCTOR LITHOGRAPHY

(75) Inventors: Minoru Iijima, Chiba (JP); Takanori Yamagishi, Chiba (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 1116 days.

(21) Appl. No.: 11/800,295

(22) Filed: May 4, 2007

(65) Prior Publication Data

US 2007/0269741 A1  Nov. 22, 2007

(30) Foreign Application Priority Data

May 18, 2006 (JP) ................................. 2006-138768

(51) Int. Cl.
*C08F 18/02* (2006.01)
(52) U.S. Cl. ...... 526/318; 526/280; 526/281; 526/307.5
(58) Field of Classification Search .................. 526/318, 526/280, 281, 307.5
See application file for complete search history.

(56) References Cited

FOREIGN PATENT DOCUMENTS

| JP | 59-45439 | | 3/1984 |
|----|----------|---|--------|
| JP | 62-115440 | | 5/1987 |
| JP | 5-113667 | | 5/1993 |
| JP | 9-73173 | | 3/1997 |
| JP | 9-90637 | | 4/1997 |
| JP | 10-26828 | | 1/1998 |
| JP | 10-161313 | | 6/1998 |
| JP | 10-207069 | * | 8/1998 |
| JP | 11-109632 | * | 4/1999 |
| JP | 2000-26446 | | 1/2000 |
| JP | 2001-242627 | * | 9/2001 |
| JP | 2003-140350 | * | 5/2003 |

* cited by examiner

*Primary Examiner* — Ling Choi
(74) *Attorney, Agent, or Firm* — Ware, Fressola, Van Der Sluys & Adolphson LLP

(57) ABSTRACT

A copolymer for positive type lithography, having at least a recurring unit (A) having a structure wherein an alkali-soluble group is protected by an acid-dissociating, dissolution-suppressing group, represented by the following formula (A)

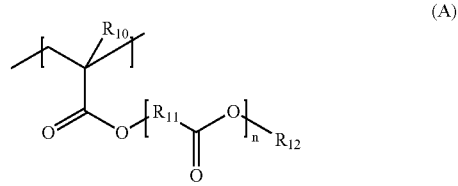

[in the formula (A), $R_{10}$ is a hydrogen atom or a hydrocarbon group which may be substituted by fluorine atom; $R_{11}$ is a crosslinked, alicyclic hydrocarbon group; n is an integer of 0 or 1; and $R_{12}$ is an acid-dissociating, dissolution-suppressing group], and a terminal structure (B) having a structure wherein an alkali-soluble group is protected by an acid-dissociating, dissolution-suppressing group, represented by the following formula (B)

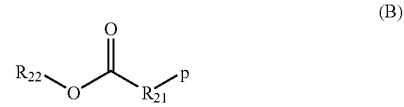

[in the formula (B), $R_{21}$ is a hydrocarbon group which may contain nitrogen atom; $R_{22}$ is an acid-dissociating, dissolution-suppressing group; and p is a site of bonding with copolymer main chain].

The copolymer is used in chemically amplified positive type lithography and is superior in lithography properties (e.g. dissolution contrast).

6 Claims, No Drawings

COPOLYMER FOR POSITIVE TYPE LITHOGRAPHY, POLYMERIZATION INITIATOR USED IN PRODUCTION OF SAID COPOLYMER, AND COMPOSITION FOR SEMICONDUCTOR LITHOGRAPHY

BACKGROUND OF THE INVENTION

1. Field of the Invention

The present invention relates to a copolymer for positive type lithography used in semiconductor production, a radical polymerization initiator used in production of said copolymer, and a composition for semiconductor lithography. More particularly, the present invention relates to a copolymer for chemically amplified positive type lithography using a radiation (e.g. deep-ultraviolet, X-rays or electron beam) and suited for microfabrication, a polymerization initiator used in production of said copolymer, and a composition for semiconductor lithography.

2. Description of the Prior Art

In the lithography employed for semiconductor production, formation of a finer pattern is necessary with an increase in integration degree. In the formation of a fine pattern, a light source of short wavelength is essential. Currently, a lithography using a Krypton fluoride (KrF) excimer laser beam (wavelength: 248 nm) is the main lithography used in semiconductor mass production and, also, a lithography using an argon fluoride (ArF) excimer laser beam (wavelength: 193 nm) is being introduced in semiconductor mass production. Further, lithographies using a fluorine dimer ($F_2$) excimer laser beam (wavelength: 157 nm), extreme ultraviolet radiation (EUV), X-rays, electron beam or the like are being developed.

In these lithographies, copolymers for chemically amplified positive type lithography are being used suitably. These polymers are constituted so as to contain the following recurring units:

a recurring unit having a structure wherein a polar group soluble in alkaline developing solution (the group may be hereinafter referred to as "alkali-soluble group") is protected by a substituent group which is unstable to acid and suppresses the solubility in alkaline developing solution (the substituent group may be hereinafter referred to as "acid-dissociating, dissolution-suppressing group") (the above structure may be hereinafter referred to as "acid-dissociating structure"), and a recurring unit having a polar group for increasing the adhesivity to semiconductor substrate or the like or for controlling the solubility in lithography solvent or alkaline developing solution.

In, for example, the lithography using a KrF excimer laser as the illuminant, there are known copolymers having a recurring unit derived from hydroxystyrene, and a recurring unit wherein a phenolic hydroxyl group derived from hydroxystyrene is protected by an acid-dissociating, dissolution-suppressing group (e.g. an acetal structure or a tertiary hydrocarbon group) or a recurring unit wherein a carboxyl group derived from (α-alkyl)acrylic acid is protected by an acid-dissociating, dissolution-suppressing group (e.g. an acetal structure or a tertiary hydrocarbon group) (reference is made to, for example, Patent Literatures 1 to 4) and the like. There are also known copolymers having a recurring unit wherein an alicyclic hydrocarbon group is used as an acid-dissociating, dissolution-suppressing group for increasing the dry etching resistance or the difference in dissolution rate in alkaline developing solution before and after light exposure (the difference may be hereinafter referred to as "dissolution contrast") (reference is made to, for example, Patent Literatures 5 to 6).

In the lithography using an ArF excimer laser of shorter wavelength or the like as the illuminant, there was investigated a copolymer having no recurring unit derived from hydroxystyrene having a high absorption coefficient to a wavelength of 193 nm. As a result, there are known copolymers having, in the recurring unit, a lactone structure (reference is made to, for example, Patent Literatures 7 to 10), or copolymers having, in the recurring unit, a polar group-containing, alicyclic hydrocarbon group (reference is made to, for example, Patent Literature 11), as a polar group for increasing the adhesivity to semiconductor substrate or the like or for controlling the solubility in lithography solvent or alkaline developing solution.

Also, there is known, as a technique for increasing dissolution contrast and enhancing the resolution of lithography, a copolymer having an acid-dissociating structure at the terminal (Patent Literature 12). However, this known technique discloses only a combination with a recurring unit having a structure wherein the hydrogen atom of phenolic hydroxyl group is substituted by the acid-dissociating, dissolution-suppressing group, and is unusable in a lithography using an ArF excimer laser and further has not been sufficient in dissolution contrast.

Incidentally, the method of introducing an acid-dissociating structure at the terminal of copolymer, disclosed in the above known technique is a method of introducing, in anionic living polymerization, an acid-dissociating structure using a polymerization terminator such as haloalkylcarboxylic acid ester having an acid-dissociating structure. Also, as a method of introducing, in radical polymerization, an acid-dissociating structure at the terminal of copolymer, there is considered a method of using a thiol compound having an acid-dissociating structure, as a chain transfer agent. Even in this method, however, when the radical polymerization initiator has no acid-dissociating structure, a terminal structure having no acid-dissociating structure is formed and improvement in lithography properties (e.g. dissolution contrast) is not sufficient.

Patent Literature 1: JP-A-1984-045439
Patent Literature 2: JP-A-1993-113667
Patent Literature 3: JP-A-1998-026828
Patent Literature 4: JP-A-1987-115440
Patent Literature 5: JP-A-1997-073173
Patent Literature 6: JP-A-1998-161313
Patent Literature 7: JP-A-1997-090637
Patent Literature 8: JP-A-1998-207069
Patent Literature 9: JP-A-2000-026446
Patent Literature 10: JP-A-2001-242627
Patent Literature 11: JP-A-1999-109632
Patent Literature 12: JP-A-2003-140350

SUMMARY OF THE INVENTION

The present invention has been made in view of the above background and aims at providing a copolymer used in chemically amplified positive type lithography and superior in lithography properties (e.g. dissolution contrast), a radical polymerization initiator used in production of said copolymer, and a composition containing said copolymer, for semiconductor lithography.

In order to achieve the above aim, the present inventors made a study. As a result, it was found that the abovementioned problems of the prior art can be solved by a copolymer having at least a recurring unit having a structure wherein the hydrogen atom of carboxyl group is protected by an acid-labile, dissolution-suppressing group and a terminal structure having a structure wherein the hydrogen atom of carboxyl group is protected by an acid-labile, dissolution-suppressing group; a radical polymerization initiator having an acid-dissociating structure, used in production of said copolymer; and a composition containing said copolymer, for semiconductor lithography. The finding has led to the completion of the present invention.

The above-mentioned problems of the prior art can be solved by the following constitution.

[1] A copolymer for positive type lithography, having at least a recurring unit (A) having a structure wherein an alkali-soluble group is protected by an acid-dissociating, dissolution-suppressing group, represented by the following formula (A)

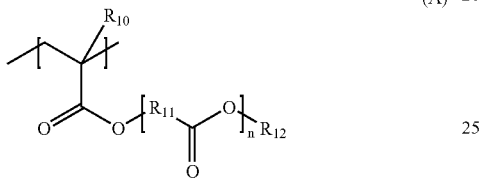

(A)

[in the formula (A), $R_{10}$ is a hydrogen atom or a hydrocarbon group of 1 to 4 carbon atoms which may be substituted by fluorine atom; $R_{11}$ is a crosslinked, alicyclic hydrocarbon group of 7 to 12 carbon atoms, crosslinked by a hydrocarbon group of 1 or 2 carbon atom, an oxygen atom or a sulfur atom; n is an integer of 0 or 1; and $R_{12}$ is an acid-dissociating, dissolution-suppressing group], and a terminal structure (B) having a structure wherein an alkali-soluble group is protected by an acid-dissociating, dissolution-suppressing group, represented by the following formula (B)

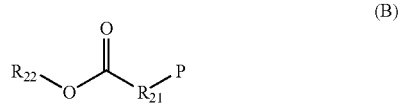

(B)

[in the formula (B), $R_{21}$ is a hydrocarbon group of 3 to 6 carbon atoms which may contain nitrogen atom; $R_{22}$ is an acid-dissociating, dissolution-suppressing group; and p is a site of bonding with copolymer main chain].

[2] A copolymer for positive type lithography, according to [1], wherein the acid-dissociating, dissolution-suppressing group $R_{12}$ in the formula (A) is selected from a structure represented by the following formula (C1)

(C1)

[in the formula (C1), o is a bonding site of $R_{12}$; $R_{31}$ and $R_{32}$ are each independently a hydrocarbon group of 1 to 4 carbon atoms; $R_{33}$ is a hydrocarbon group of 1 to 12 carbon atoms; and $R_{33}$ may be bonded with $R_{31}$ or $R_{32}$ to form a ring] and a structure represented by the following formula (C2)

(C2)

[in the formula (C2), o is a bonding site of $R_{12}$; $R_{34}$ and $R_{35}$ are each independently a hydrogen atom or a hydrocarbon group of 1 to 4 carbon atoms; $R_{36}$ is a hydrocarbon group of 1 to 12 carbon atoms; and $R_{34}$ may be bonded with $R_{35}$ or $R_{36}$ to form a ring].

[3] A copolymer for positive type lithography, according to [1], wherein the acid-dissociating, dissolution-suppressing group $R_{22}$ in the formula (B) is a structure represented by the following formula (C3)

(C3)

[in the formula (C3) o is a bonding site of $R_{22}$; $R_{37}$ and $R_{38}$ are each independently a hydrogen atom or a hydrocarbon group of 1 to 4 carbon atoms; $R_{39}$ is a hydrocarbon group of 1 to 12 carbon atoms; $R_{37}$ may be bonded with $R_{38}$ or $R_{39}$ to form a ring; and $R_{39}$ may be bonded with the terminal structure (B)].

[4] A copolymer for positive type lithography, according to any of [1] to [3], which contains a recurring unit (D) having a lactone structure, represented by the following formula (D)

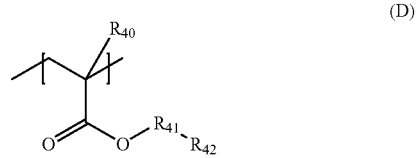

(D)

{in the formula (D), $R_{40}$ is a hydrogen atom, or a hydrocarbon group of 1 to 4 carbon atoms which may be substituted by fluorine atom; $R_{41}$ is a single bond, or an alicyclic hydrocarbon group of 5 to 12 carbon atoms which may be crosslinked via a hydrocarbon group of 1 or 2 carbon atoms, an oxygen atom or a sulfur atom; $R_{42}$ is a lactone structure represented by the following formula (L)

(L)

[in the formula (L), any one or two of $R_{43}$ to $R_{48}$ are each a single bond bonding with $R_{41}$ in the formula (D) and the remainder is a hydrogen atom or a hydrocarbon group or alkoxy group of 1 to 4 carbon atoms]; and $R_{42}$ is bonded with $R_{41}$ via one or two single bonds}.

[5] A copolymer for positive type lithography, according to any of [1] to [4], which contains a recurring unit (E) having hydroxyl group.

[6] A copolymer for positive type lithography, according to [1], wherein the repeating unit (E) having hydroxyl group is a recurring unit (E11) having hydroxyl group-substituted adamantyl group, represented by the following formula (E11)

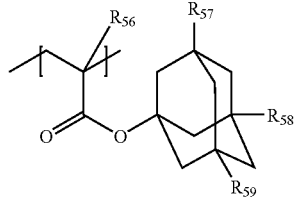

(E11)

[in the formula (E11), $R_{56}$ is a hydrogen atom, or a hydrocarbon group of 1 to 4 carbon atoms which may be substituted by fluorine atom; $R_{57}$ to $R_{59}$ are each independently a hydrogen atom or a hydroxyl group; and at least one of $R_{57}$ to $R_{59}$ is a hydroxyl group].

[7] A radical polymerization initiator represented by the following formula (G)

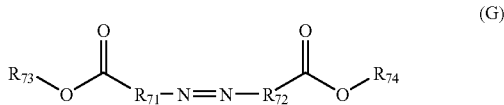

(G)

[in the formula (G), $R_{71}$ and $R_{72}$ are each a hydrocarbon group of 3 to 6 carbon atoms which may contain nitrogen atom; $R_{73}$ and $R_{74}$ are each a hydrogen atom or an acid-dissociating, dissolution-suppressing group; and at least one of $R_{73}$ and $R_{74}$ is an acid-dissociating, dissolution-suppressing group].

[8] A composition for semiconductor lithography, which contains a copolymer set forth in any of [1] to [6], a radiation-sensitive, acid-generating agent and a solvent.

According to the present invention, there can be provided a copolymer used in chemically amplified positive type lithography and superior in lithography properties (e.g. dissolution contrast), a radical polymerization initiator used in production of said copolymer, and a composition containing said copolymer, for lithography.

DETAILED DESCRIPTION OF THE INVENTION

The present invention is described in more detail below.
1. Recurring Unit (A)
The recurring unit (A) has a structure wherein the hydrogen atom of the carboxyl group (which is an alkali-soluble group) is protected by an acid-dissociating, dissolution-suppressing group, functions so as to change the solubility of the present copolymer in alkaline developing solution, and can be represented by the following formula (A).

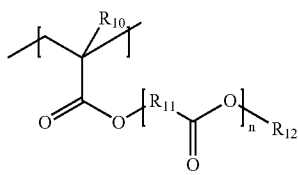

(A)

In the formula (A), $R_{10}$ is a hydrogen atom or a hydrocarbon group of 1 to 4 carbon atoms which may be substituted by fluorine atom. As specific examples, there can be mentioned hydrogen atom, methyl group, ethyl group, n-propyl group, isopropyl group, n-butyl group, isobutyl group and trifluoromethyl group, and there are preferred hydrogen atom, methyl group and trifluoromethyl group.

$R_{11}$ is a crosslinked, alicyclic hydrocarbon group of 7 to 12 carbon atoms, crosslinked by a hydrocarbon group of 1 or 2 carbon atoms, an oxygen atom or a sulfur atom. As specific examples, there can be mentioned hydrocarbon groups having norbornane ring, tetracyclo[$4.4.0.1^{2,5}.1^{7,10}$]dodecane ring, 7-oxa-norbornane ring or 7-thia-norbornane ring, and there are preferred a hydrocarbon group having tetracyclo[$4.4.0.1^{2,5}.1^{7,10}$]dodecane ring. Incidentally, n is an integer of 0 or 1.

$R_{12}$ is an acid-dissociating, dissolution-suppressing group and is preferably selected from a structure of the following formula (C1) and a structure of the following formula (C2).

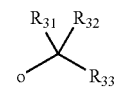

(C1)

In the formula (C1), o is a bonding site of $R_{12}$. $R_{31}$ and $R_{32}$ are each independently a hydrocarbon group of 1 to 4 carbon atoms. As specific examples thereof, there can be mentioned methyl group, ethyl group, n-propyl group, isopropyl group, n-butyl group and isobutyl group. $R_{33}$ is a hydrocarbon group of 1 to 12 carbon atoms. As specific examples thereof, there can be mentioned methyl group, ethyl group, n-propyl group, isopropyl group, n-butyl group, isobutyl group, cyclopentyl group, cyclohexyl group, norbornyl group, tricyclo[$5.2.1.0^{2,6}$]decanyl group, adamantyl group and tetracyclo[$4.4.0.1^{2,5}.1^{7,10}$]dodecanyl group. Incidentally, $R_{33}$ may be bonded with $R_{31}$ or $R_{32}$ to form a ring (specific examples of the ring are cyclopentane ring, cyclohexane ring, norbornane ring, tricyclo[$5.2.1.0^{2,6}$]decane ring, adamantane ring and tetracyclo[$4.4.0.1^{2,5}.1^{7,10}$]dodecane ring).

When $R_{33}$ itself, or is bonded with $R_{31}$ or $R_{32}$ to form a ring such as cyclopentane ring, cyclohexane ring, norbornane ring, tricyclo[$5.2.1.0^{2,6}$]decane ring, adamantane ring, tetracyclo[$4.4.0.1^{2,5}.1^{7,10}$]dodecane ring) or the like, the difference in solubility in alkaline developing solution before and after lithography is large, which is preferred for formation of fine pattern.

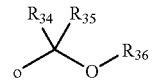

(C2)

In the formula (C2), o is a bonding site of $R_{12}$. $R_{34}$ and $R_{35}$ are each independently a hydrogen atom or a hydrocarbon group of 1 to 4 carbon atoms. As specific examples thereof, there can be mentioned hydrogen atom, methyl group, ethyl group, n-propyl group, isopropyl group, n-butyl group and isobutyl group. $R_{36}$ is a hydrocarbon group of 1 to 12 carbon atoms. As specific examples thereof, there can be mentioned methyl group, ethyl group, n-propyl group, isopropyl group, n-butyl group, isobutyl group, tert-butyl group, 2-ethylhexyl group, cyclopentyl group, cyclohexyl group, norbornyl group, tricyclo[$5.2.1.0^{2,6}$]decanyl group, adamantyl group and tetracyclo[$4.4.0.1^{2,5}.1^{7,10}$]dodecanyl group. Incidentally, $R_{34}$ may be bonded with $R_{35}$ or $R_{36}$ to form a ring; as specific examples of the ring formed by bonding of $R_{34}$ with $R_{35}$, there can be mentioned hydrofuran ring and hydropyran ring and, as specific examples of the ring formed by bonding of $R_{34}$ with $R_{36}$, there can be mentioned cyclopentane ring, cyclohexane ring, norbornane ring, tricyclo[$5.2.1.0^{2,6}$]decane ring, adamantane ring and tetracyclo[$4.4.0.1^{2,5}.1^{7,10}$]dodecane ring.

Specific examples of the recurring unit (A) are shown below. However, the present invention is not restricted to these specific examples. Incidentally, the monomers giving these recurring units can be used singly or in combination of two or more kinds.

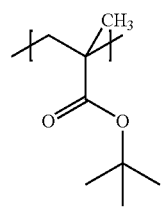
(A101)

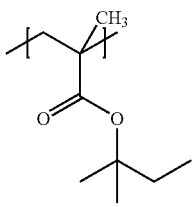
(A102)

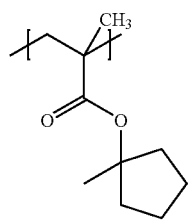
(A103)

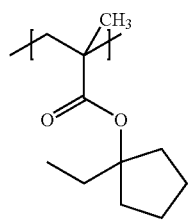
(A104)

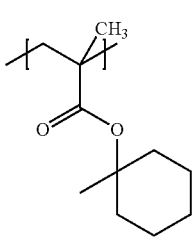
(A105)

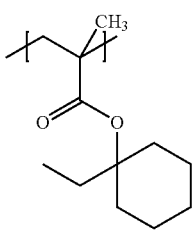
(A106)

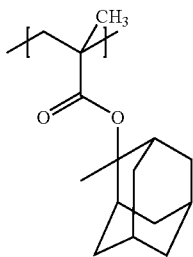
(A107)

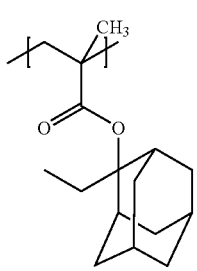
(A108)

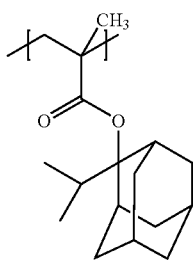
(A109)

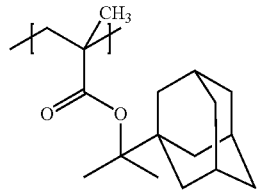
(A110)

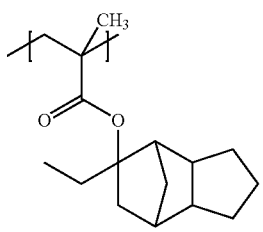
(A111)

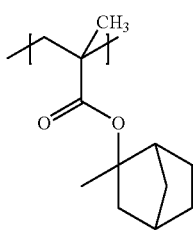
(A112)

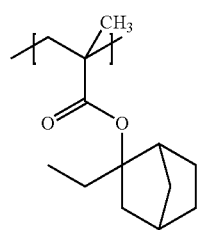 (A113)
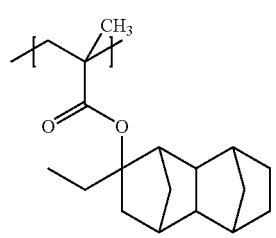 (A114)
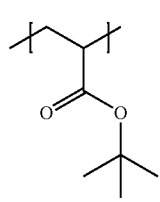 (A121)
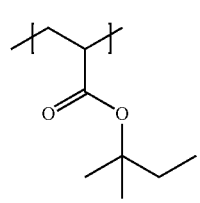 (A122)
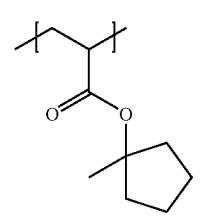 (A123)
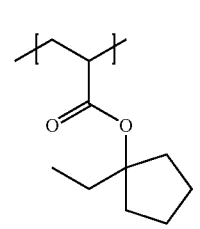 (A124)
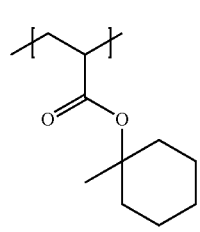 (A125)
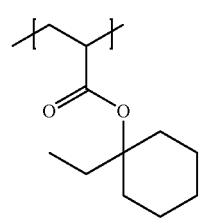 (A126)
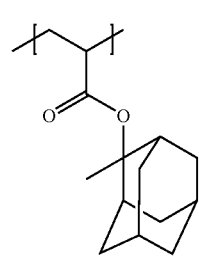 (A127)
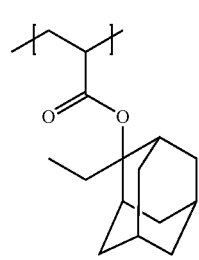 (A128)
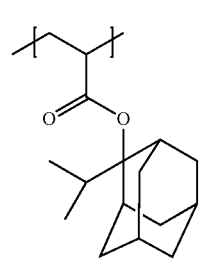 (A129)
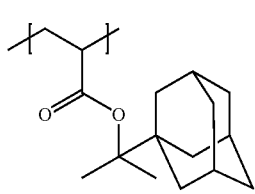 (A130)
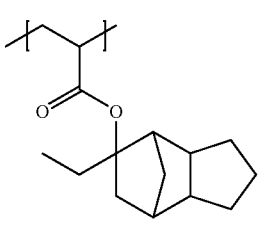 (A131)
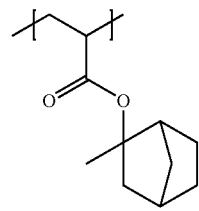 (A132)

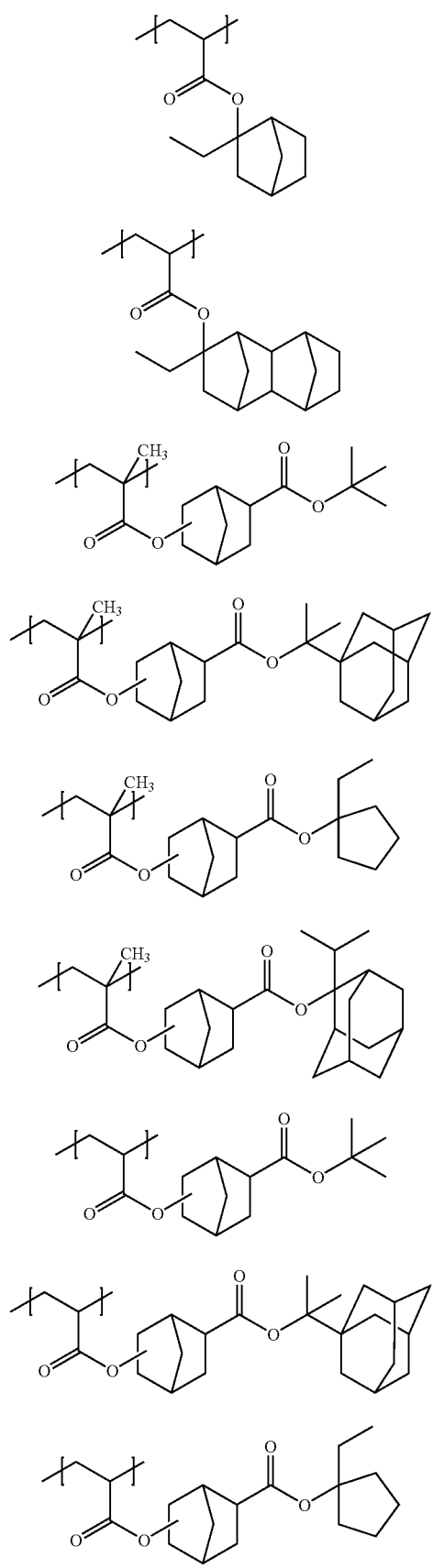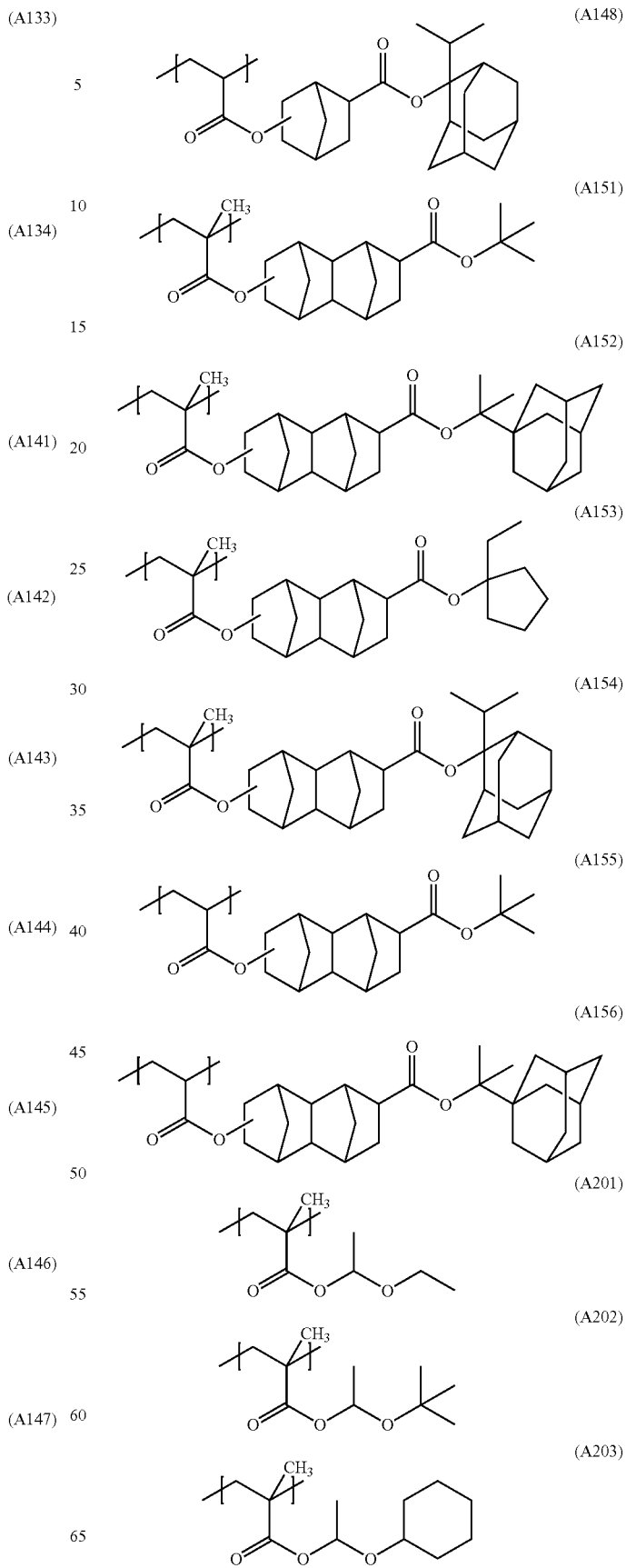

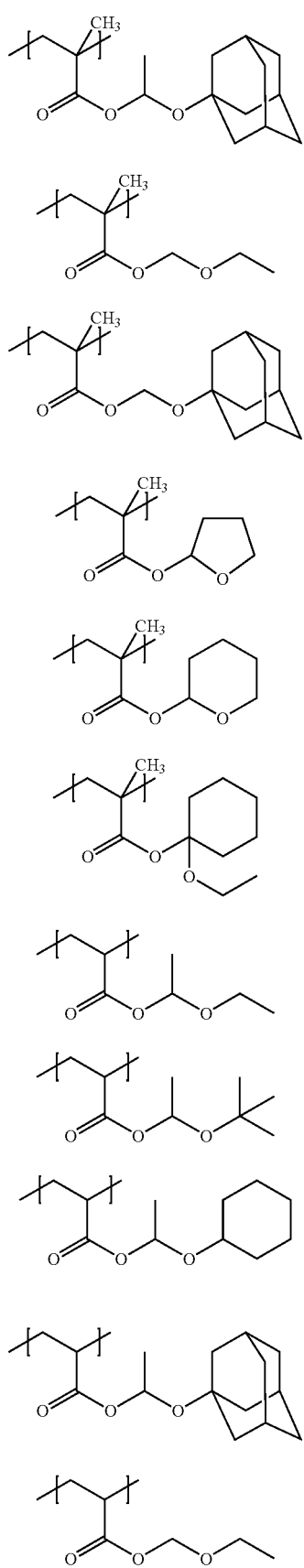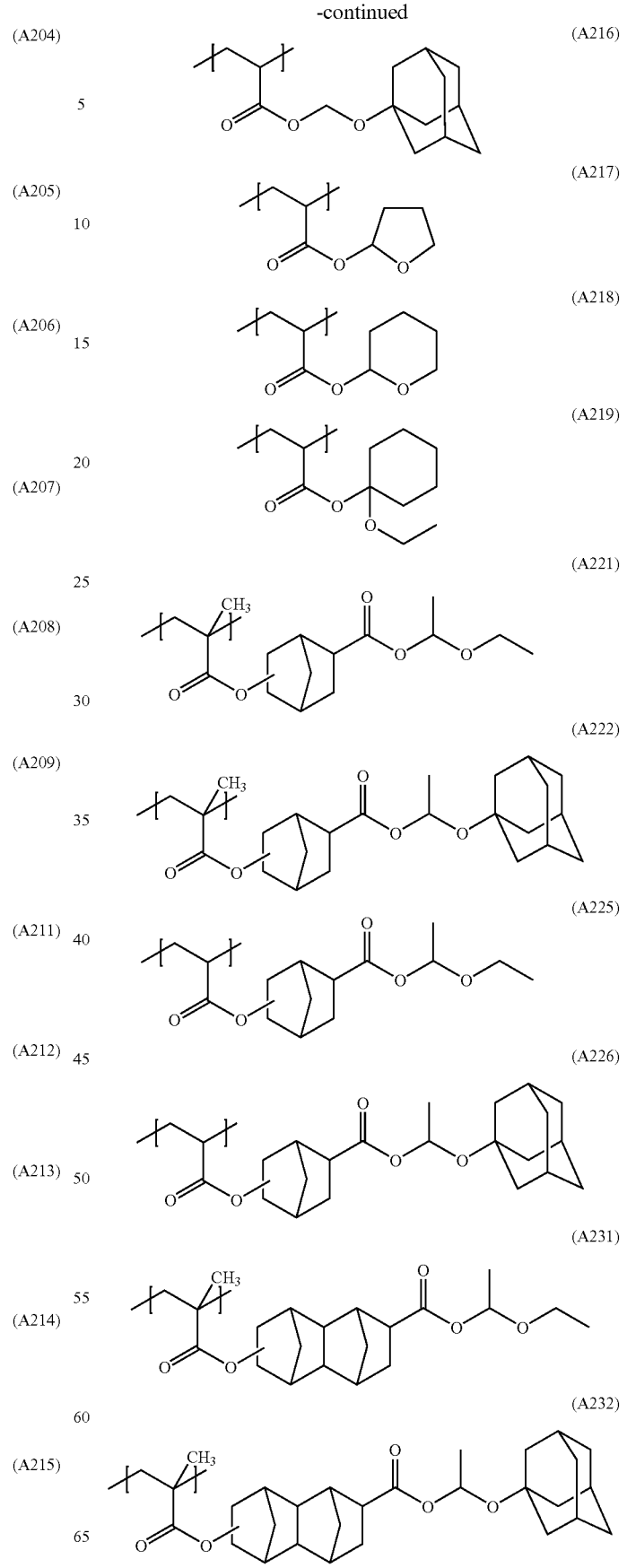

(A235)

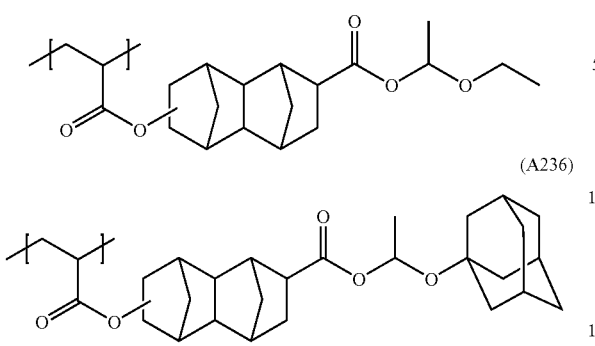

(A236)

(b4)

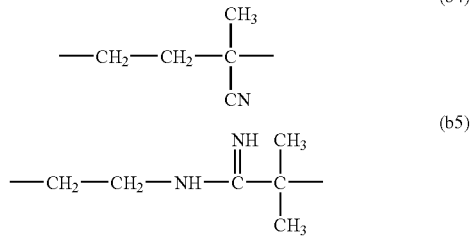

(b5)

$R_{22}$ is an acid-dissociating, dissolution-suppressing group and is preferably a structure represented by the following formula (C3).

2. Terminal Structure (B)

The terminal structure (B) is a structure wherein the hydrogen atom of the carboxyl group (which is an alkali-soluble group) is protected by an acid-dissociating, solubility-suppressing group, functions so as to enhance the solubility of present copolymer in alkaline developing solution, and can be represented by the following formula (B).

(C3)

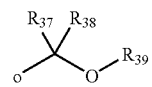

Incidentally, p is a site of boding with copolymer main chain.

In the formula (C3), o is a bonding site of $R_{22}$. $R_{37}$ and $R_{38}$ are each independently a hydrogen atom or a hydrocarbon group of 1 to 4 carbon atoms. As specific examples thereof, there can be mentioned hydrogen atom, methyl group, ethyl group, n-propyl group, isopropyl group, n-butyl group and isobutyl group. $R_{39}$ is a hydrocarbon group of 1 to 12 carbon atoms. As specific examples thereof, there can be mentioned methyl group, ethyl group, n-propyl group, isopropyl group, n-butyl group, isobutyl group, tert-butyl group, 2-ethylhexyl group, cyclopentyl group, cyclohexyl group, norbornyl group, tricyclo[5.2.1.0$^{2,6}$]decanyl group, adamantyl group and tetracyclo[4.4.0.1$^{2,5}$.1$^{7,10}$]dodecanyl group. Incidentally, $R_{37}$ may be bonded with $R_{38}$ or $R_{39}$ to form a ring; as specific examples of the ring formed by bonding of $R_{37}$ with $R_{38}$, there can be mentioned cyclopentane ring, cyclohexane ring, norbornane ring, tricyclo[5.2.1.0$^{2,6}$]decane ring, adamantane ring and tetracyclo[4.4.0.1$^{2,5}$.1$^{7,10}$]dodecane ring and, as specific examples of the ring formed by bonding of $R_{37}$ with $R_{39}$, there can be mentioned hydrofuran ring and hydropyran ring. Incidentally, $R_{39}$ may be bonded with other terminal structure (B); in this case, the formula (B) becomes a structure in copolymer main chain but is a structure at the initial point of polymerization; therefore, such a structure, bonded with other structure (B), is also called terminal structure.

(B)

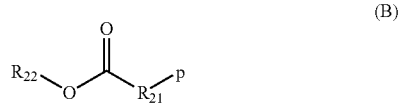

In the formula (B), $R_{21}$ is a hydrocarbon group of 3 to 6 carbon atoms which may contain nitrogen atom. As specific examples thereof, there can be mentioned the structures represented by following formulas (b1) to (b5).

Specific examples of the terminal structure (B) are shown below. However, the present invention is not restricted to these specific examples. Incidentally, the initiators giving these terminal structures can be used singly or in combination of two or more kinds.

(B211)

(B231)

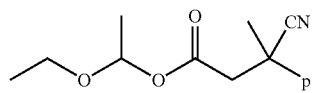

(B241)

(B242)

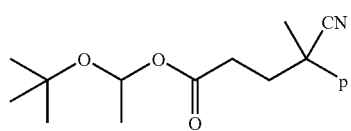

(B243)
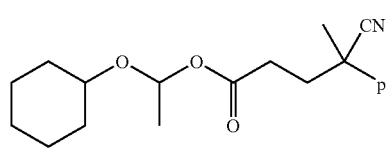

(B244)
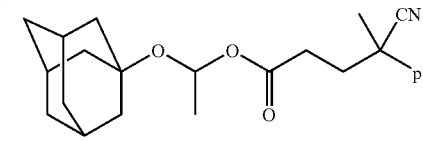

(B245)
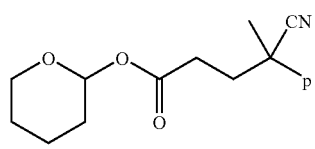

(B246)
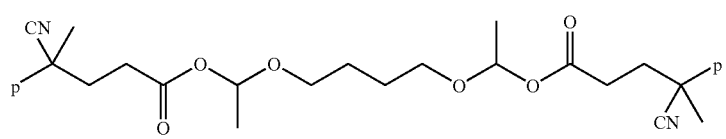

(B247)
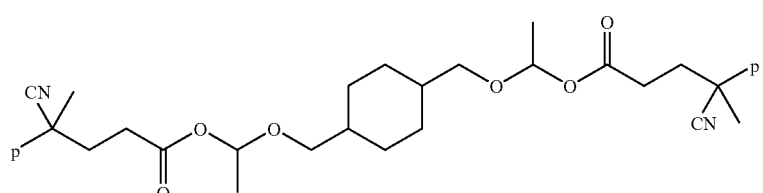

(B248)
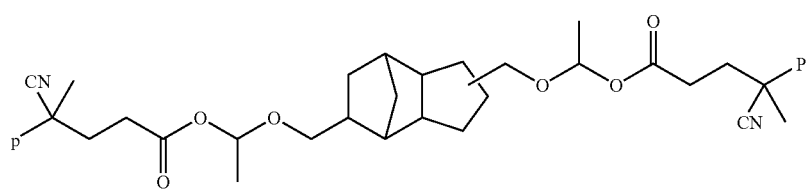

(B249)
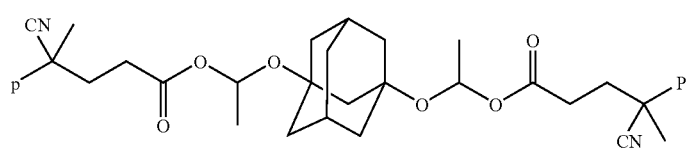

3. Recurring Unit (D)

The copolymer of the present invention is preferred to contain a recurring unit (D) having a lactone structure, in order to enhance the adhesivity to semiconductor substrate or control the solubility in lithography solvent or alkaline developing solution. As an example of the recurring unit (D), there can be mentioned a structure represented by the following formula (D).

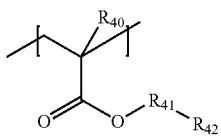
(D)

In the formula (D), $R_{40}$ is a hydrogen atom or a hydrocarbon group of 1 to 4 carbon atoms which may be substituted by fluorine atom. As specific examples thereof, there can be mentioned hydrogen atom, methyl group, ethyl group, n-propyl group, isopropyl group, n-butyl group, isobutyl group and trifluoromethyl group. Preferred are hydrogen atom, methyl group and trifluoromethyl group. $R_{41}$ is a single bond or an alicyclic hydrocarbon group of 5 to 12 carbon atoms which may be crosslinked by a hydrocarbon group of 1 or 2 carbon atoms, an oxygen atom or a sulfur atom. As specific examples thereof, there can be mentioned single bond, cyclohexane ring, norbornane ring, tetracyclo[4.4.0.1$^{2,5}$.1$^{7,10}$]dodecane ring, 7-oxa-norbornane ring and 7-thia-norbornane ring.

In the formula (D), $R_{42}$ is a lactone structure represented by the following formula (L)

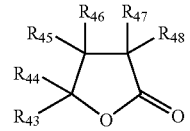
(L)

and is bonded with $R_{41}$ via one or two single bonds.

In the formula (L), any one or two of $R_{43}$ to $R_{48}$ are each a single bond bonded with $R_{41}$ of the formula (D), and the remainder is each a hydrogen atom or a hydrocarbon group or alkoxy group of 1 to 4 carbon atoms.

Specific examples of the recurring unit (D) are shown below. However, the present invention is not restricted to these specific examples. Incidentally, the monomers giving these recurring units can be used singly or in combination of two or more kinds.
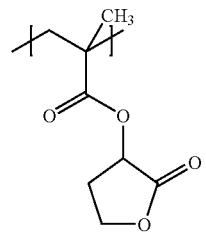
(D101)
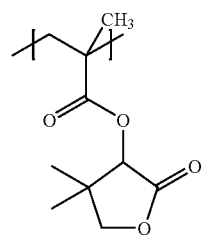
(D102)
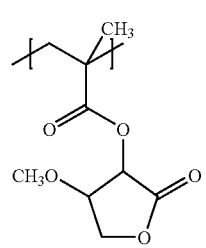
(D103)
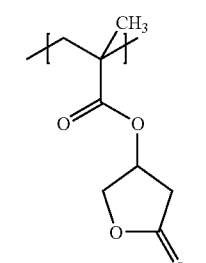
(D104)
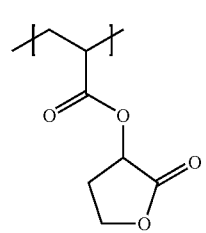
(D105)
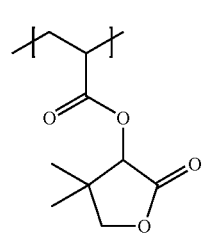
(D106)
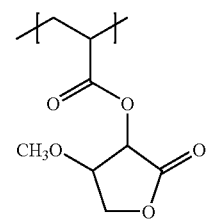
(D107)
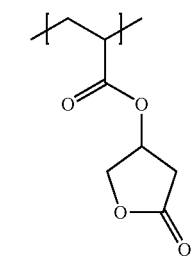
(D108)
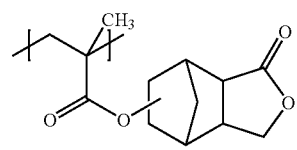
(D111)
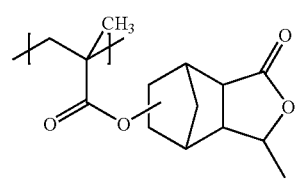
(D112)
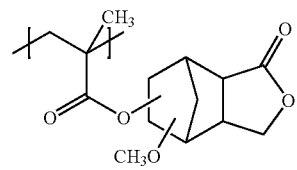
(D113)
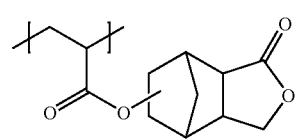
(D115)
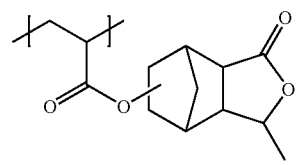
(D116)
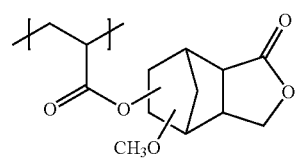
(D117)
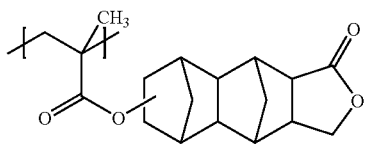
(D121)

-continued
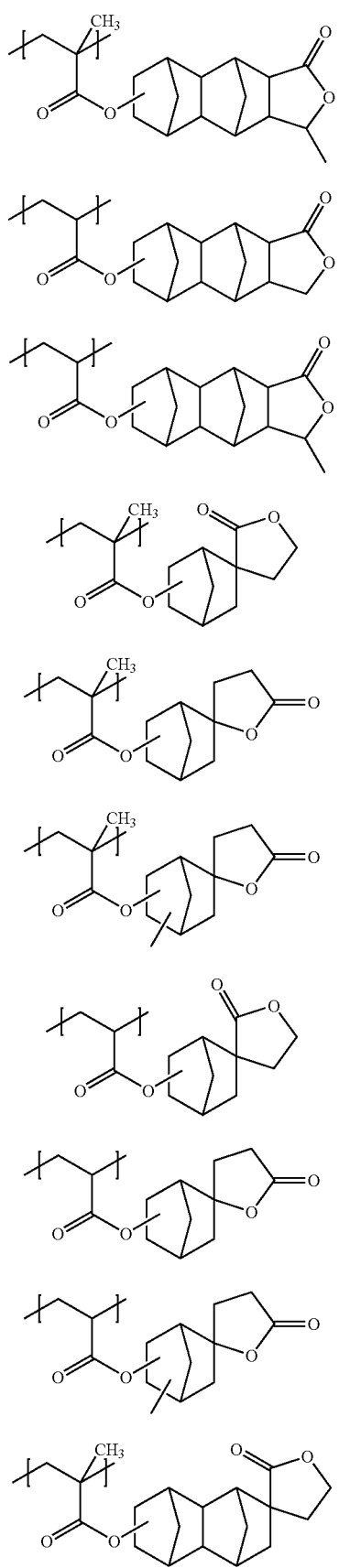
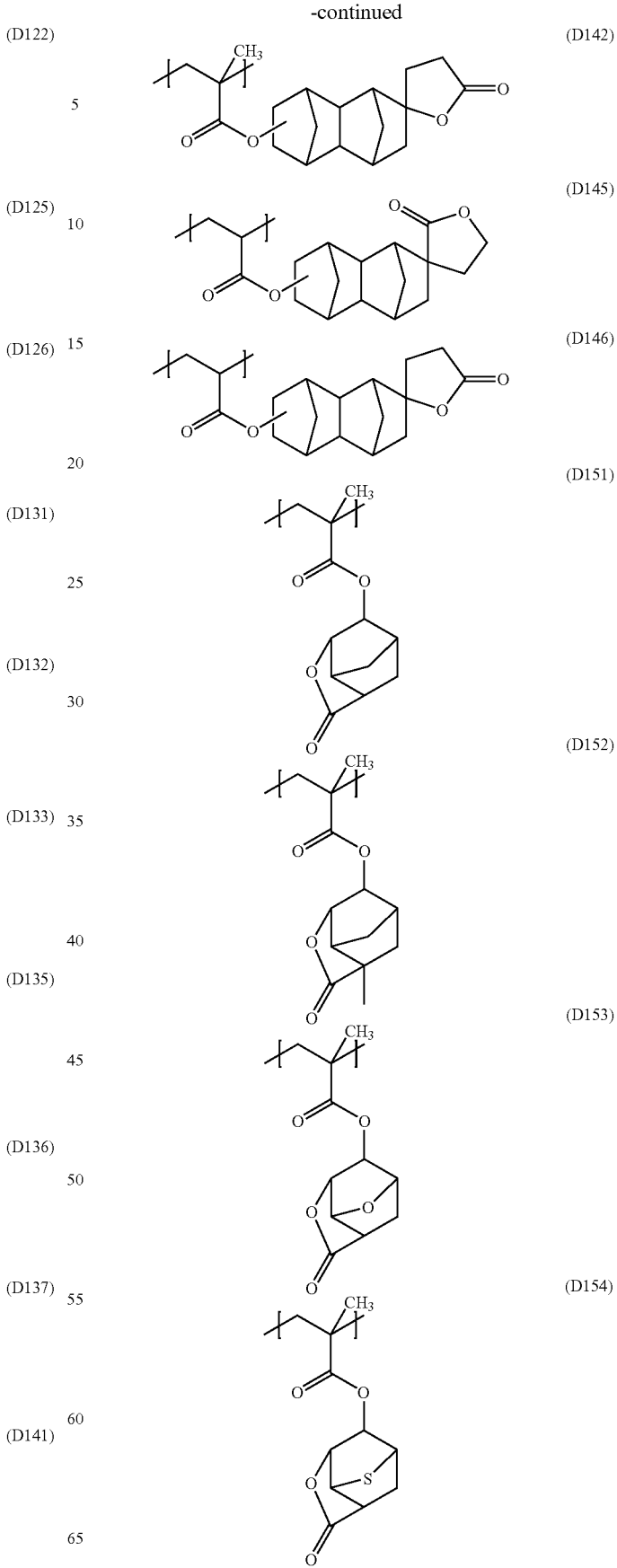

(D155) 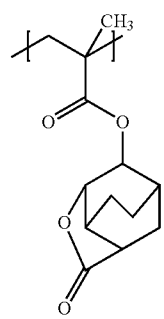
(D156) 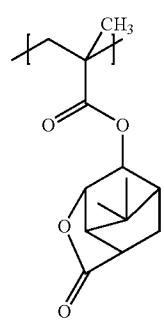
(D157) 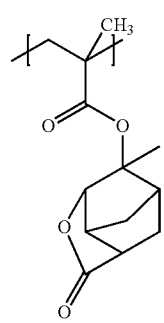
(D158) 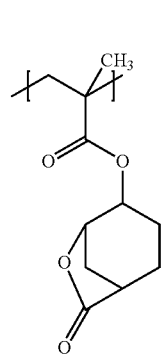
(D159) 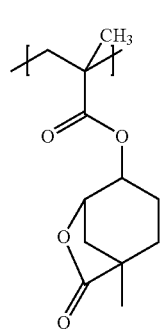
(D160) 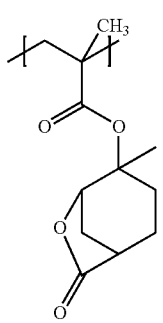
(D171) 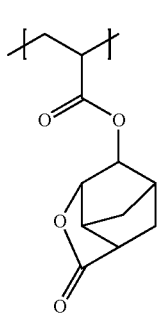
(D172) 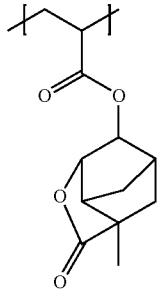
(D173) 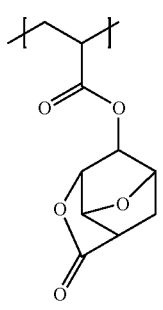
(D174) 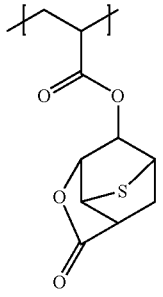

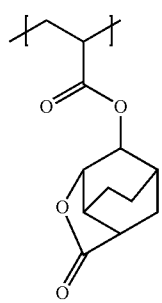
(D175)

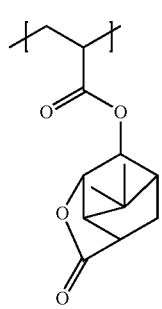
(D186)

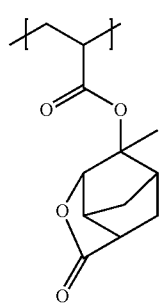
(D187)

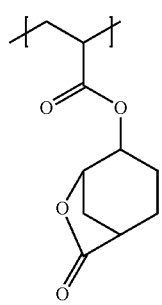
(D188)

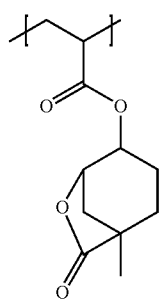
(D189)

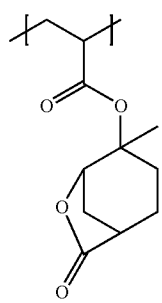
(D190)

4. Recurring Unit (E)

The copolymer of the present invention is preferred to contain a recurring unit (E) having hydroxyl group, in order to enhance the adhesivity to semiconductor substrate or control the solubility in lithography solvent or alkaline developing solution.

As examples of the recurring unit (E), there can be mentioned a recurring unit having alcoholic hydroxyl group, represented by the following formula (E1)

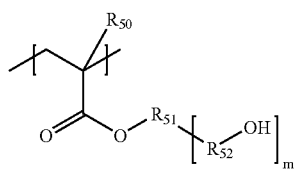
(E1)

[in the formula (E1), $R_{50}$ is a hydrogen atom or a hydrocarbon group of 1 to 4 carbon atoms which may be substituted by fluorine atom; $R_{51}$ is a hydrocarbon group of 2 to 12 carbon atoms which may be substituted by fluorine atom; m is an integer of 1 to 3; and $R_{52}$ is a single bond or a hydrocarbon group of 3 to 6 carbon atoms which may be substituted by fluorine atom]; a recurring unit having carboxyl group, represented by the following formula (E2)

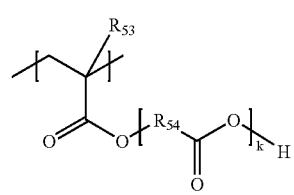
(E2)

[in the formula (E2), $R_{53}$ is a hydrogen atom or a hydrocarbon group of 1 to 4 carbon atoms which may be substituted by fluorine atom; $R_{54}$ is a crosslinked, alicyclic hydrocarbon group of 7 to 12 carbon atoms, crosslinked by a hydrocarbon group of 1 or 2 carbon atoms, an oxygen atom or a sulfur atom; and k is an integer of o or 1]; a recurring unit having phenolic hydroxyl group, represented by the following formula (E3)

(E3)

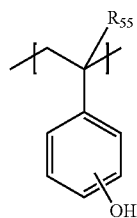

[in the formula (E3), $R_{55}$ is a hydrogen atom or a hydrocarbon group of 1 to 4 carbon atoms which may be substituted by fluorine atom]; and a recurring unit having hydroxyl group-substituted adamantyl group, represented by the following formula (E11)

(E11)

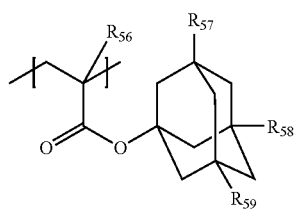

[in the formula (E11), $R_{56}$ is a hydrogen atom or a hydrocarbon group of 1 to 4 carbon atoms which may be substituted by fluorine atom; $R_{57}$ to $R_{59}$ are each independently a hydrogen atom or a hydroxyl group; and at least one of $R_{57}$ to $R_{59}$ is a hydroxyl group].

Of the above recurring units (E), the recurring unit (E11) represented by the formula (E11) is particularly preferred because the copolymer containing the recurring unit (E11) is superior in light transmittance and etching resistance.

Specific examples of the recurring unit (E) are shown below. However, the present invention is not restricted to these specific examples. Incidentally, the monomers giving these recurring units can be used singly or in combination of two or more kinds.

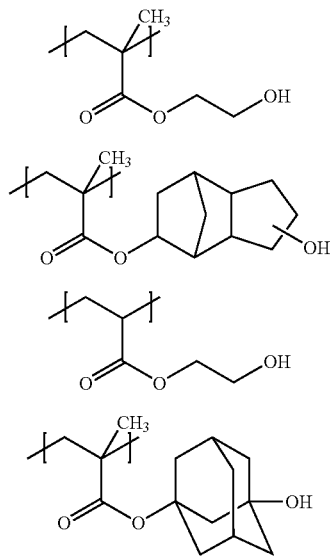

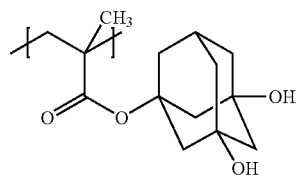
(E112)

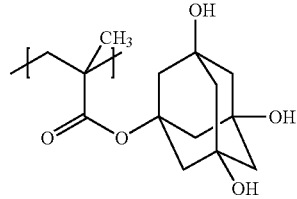
(E113)

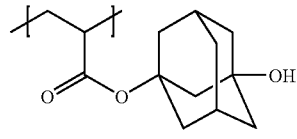
(E115)

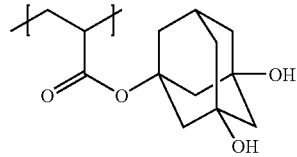
(E116)

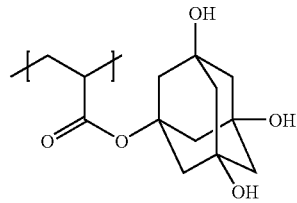
(E117)

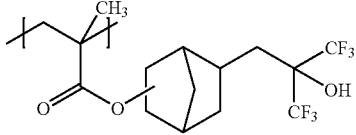
(E121)

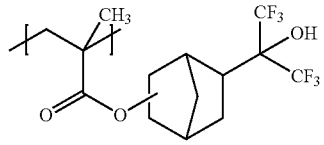
(E122)

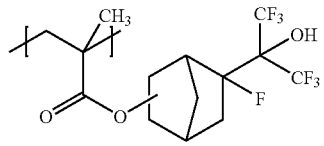
(E123)

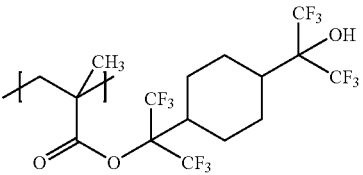
(E124)

(E125) 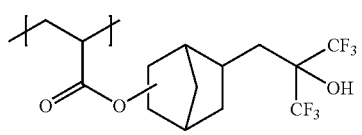

(E126) 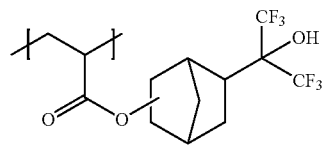

(E127) 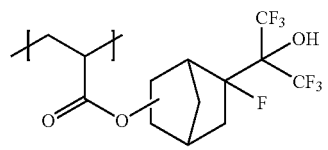

(E128) 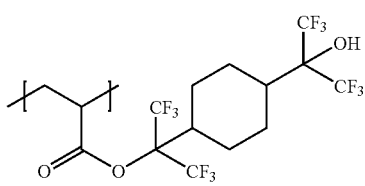

(E201) 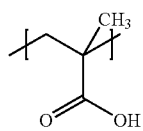

(E202) 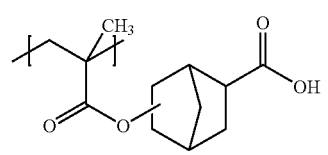

(E203) 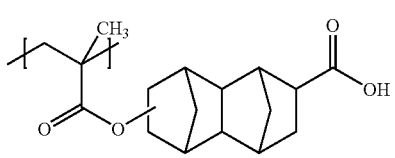

(E205) 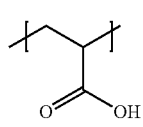

(E206) 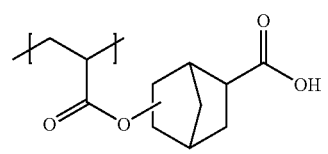

(E207) 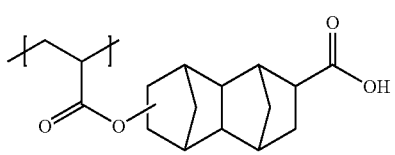

(E301) 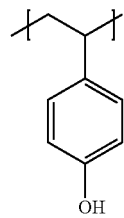

(E302) 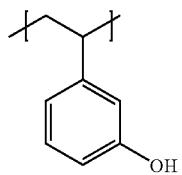

(E303) 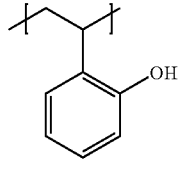

(E304) 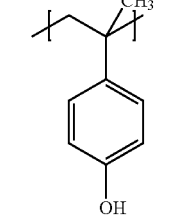

5. Recurring Unit (F)

The copolymer of the present invention can contain, if necessary, a recurring unit (F) having an acid-stable dissolution-suppressing group, in order to control the solubility in alkaline developing solution or lithography solvent. As examples of the recurring unit (F), there can be mentioned a recurring unit represented by the following formula (F1)

(F1)

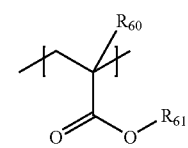

[in the formula (F1), $R_{60}$ is a hydrogen atom or a hydrocarbon group of 1 to 4 carbon atoms which may be substituted by fluorine atom; and $R_{61}$ is an alicyclic hydrocarbon group of 5 to 12 carbon atoms wherein the carbon bonding with oxygen atom is tertiary carbon or an adamantyl group], and a recurring unit represented by the following formula (F2)

(F2)

[in the formula (F2), $R_{62}$ is a hydrogen atom or a hydrocarbon group of 1 to 4 carbon atoms which may be substituted by fluorine atom; $R_{63}$ is an aromatic hydrocarbon group of 6 to 12 carbon atoms; and $R_{64}$ is a hydrogen atom or a group of 1 to 2 carbon atoms bonding with $R_{63}$].

Specific examples of the recurring unit (F) are shown below. However, the present invention is not restricted to these specific examples. Incidentally, the monomers giving these recurring units can be used singly or in combination of two or more kinds.

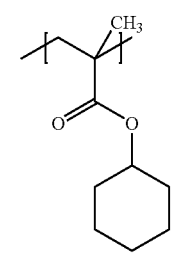
(F101)

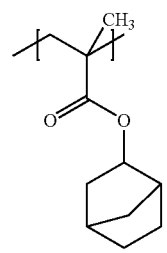
(F102)

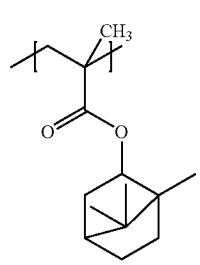
(F103)

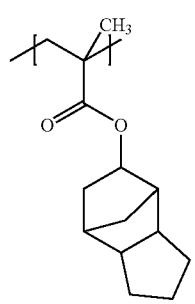
(F104)

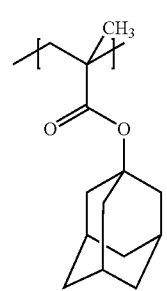
(F105)

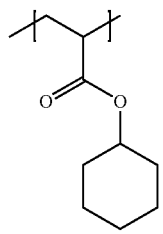
(F111)

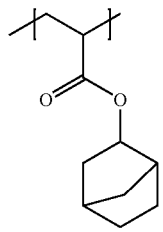
(F112)

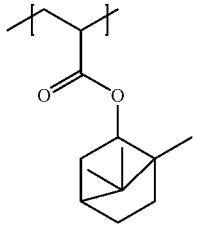
(F113)

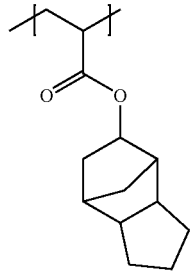
(F114)

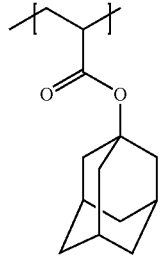
(F115)

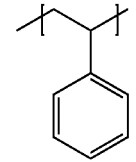
(F201)

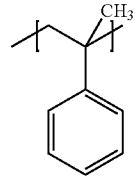
(F202)

-continued

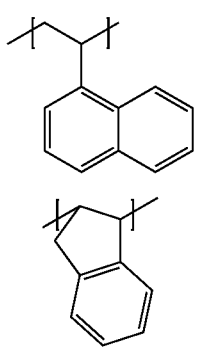

(F203)

(F204)

The proportion of each recurring unit can be selected in a range in which the basic properties of semiconductor lithography are not impaired. It can be selected in the following range.

Recurring unit (A): 10 to 80 mole %, preferably 15 to 70 mole %, more preferably 20 to 60 mole %

Terminal structure (B): 0.1 to 25 mole %, preferably 0.5 to 15 mole %, more preferably 1 to 10 mole %

Recurring unit (D): 0 to 80 mole %, preferably 10 to 70 mole %, more preferably 20 to 60 mole %

Recurring unit (E): ordinarily 0 to 80 mole %, preferably 5 to 70 mole %, more preferably 10 to 60 mole %

Recurring unit (F): ordinarily 0 to 30 mole %, preferably 0 to 20 mole %, more preferably 0 to 10 mole %

The weight-average molecular weight (Mw) of the present copolymer is in a range of preferably 1,000 to 40,000, more preferably 1,500 to 30,000, particularly preferably 2,000 to 20,000 because too high a molecular weight results in low solubility in resist solvent or alkaline developing solution and too low a molecular weight results in inferior properties of resist film.

The molecular weight distribution (Mw/Mn) of the present copolymer is in a range of preferably 1.0 to 5.0, more preferably 1.0 to 3.0, particularly preferably 1.2 to 2.5.

6. Polymerization Initiator (G), (g)

The terminal structure of the present copolymer, represented by the above formula (B) can be synthesized, for example, by conducting polymerization using a radical polymerization initiator (G) represented by the following formula (G)

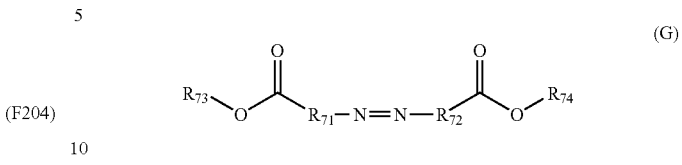

(G)

[in the formula (G), $R_{71}$ and $R_{72}$ are each a hydrocarbon group of 3 to 6 carbon atoms which may contain nitrogen atom; $R_{73}$ and $R_{74}$ are each a hydrogen atom or an acid-dissociating, dissolution-suppressing group; and at least one of $R_{73}$ and $R_{74}$ is an acid-dissociating, dissolution-suppressing group], or by conducting polymerization using a radical polymerization initiator (g) represented by the following formula (g)

(g)

[in the formula (g), $R_{75}$ and $R_{76}$ are each a hydrocarbon group of 3 to 6 carbon atoms which may contain nitrogen atom] and then reacting, with, for example, an enol ether corresponding to the structure of the formula (B), in the presence of an acid catalyst. Incidentally, the radical polymerization initiator (G) can be synthesized, for example, by reacting with an enol ether corresponding to the structure of the formula (B), in the presence of an acid catalyst.

Specific examples of the $R_{71}$ and $R_{72}$ of the formula (G) and the $R_{75}$ and $R_{76}$ of the formula (g) are the same as the specific examples (mentioned above) of the $R_{21}$ of the formula (B). The $R_{73}$ and $R_{74}$ of the formula (G) are preferably the structure represented by the formula (C3), and specific examples thereof are the same as the specific examples (mentioned above) of the $R_{22}$ of the formula (B).

Specific examples of the radical polymerization initiators (G) and (g) are shown below. However, the present invention is not restricted to these specific examples. Incidentally, these radical polymerization initiators can be used singly or in combination of two or more kinds.

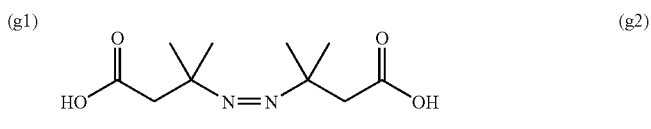

(g1) (g2)

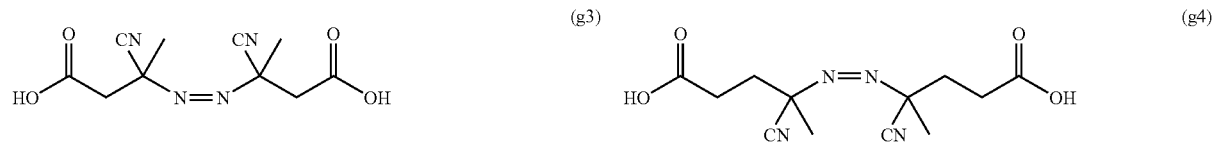

(g3) (g4)

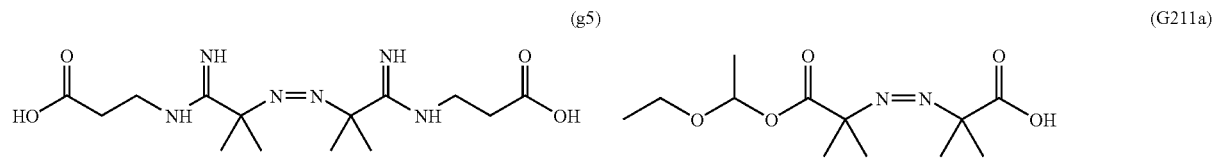

(g5) (G211a)

(G211b)
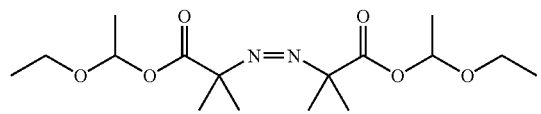
(G241a)
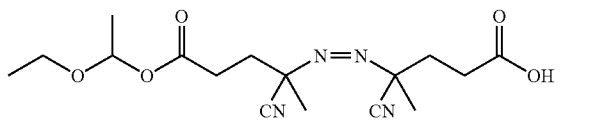
(G241b)
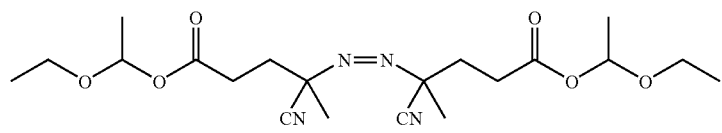
(G243a)
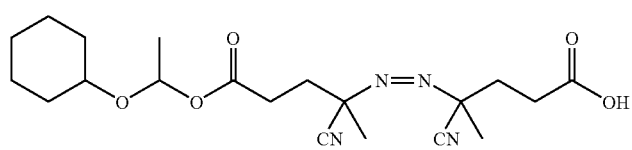
(G243b)
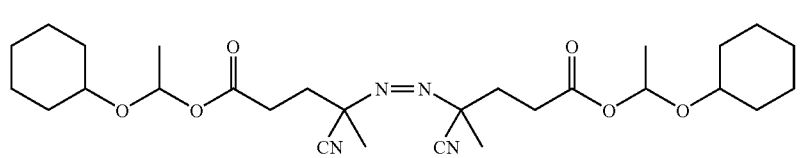
(G244a)
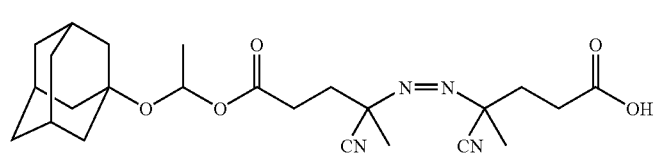
(G244b)
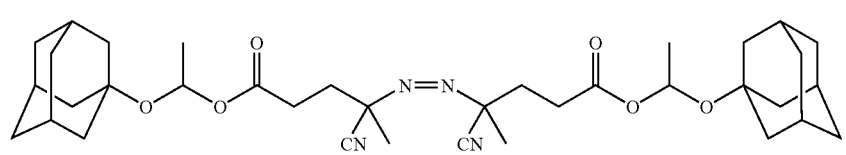
(G245a)
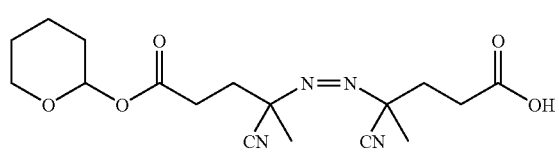
(G245b)
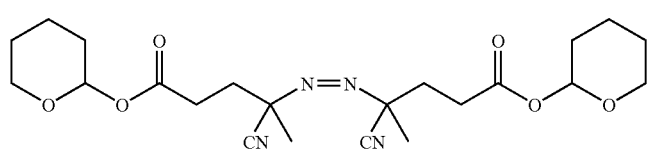
(G246a)
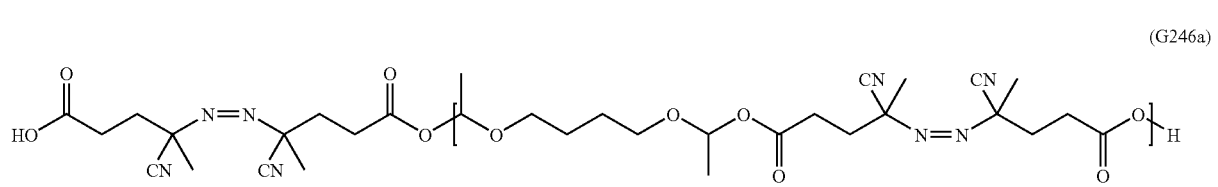
(G246c)
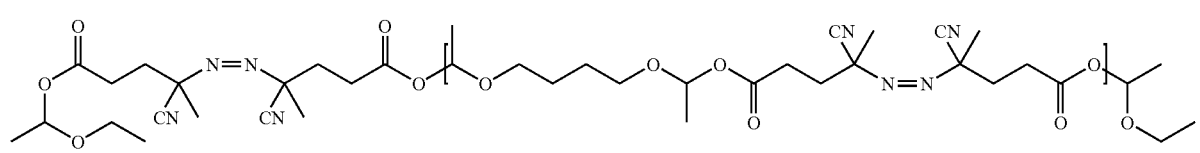

(G248a)

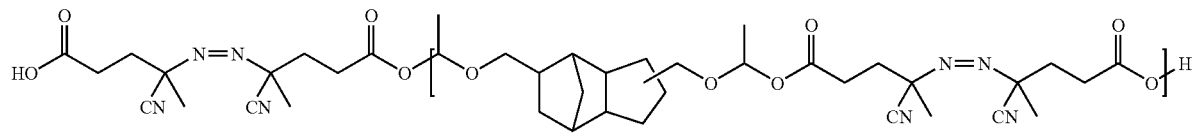

Next, description is made on the process for producing the copolymer of the present invention. The copolymer of the present invention can be produced via a step (P) of radical-polymerizing at least a monomer corresponding to the recurring unit (A), in an organic solvent in the presence of a radical polymerization initiator giving the terminal structure (B). In the process for production of the present copolymer, there can also be employed, if necessary, a step (R) of removing, from the copolymer produced, unnecessary materials such as unreacted materials (e.g. unreacted monomer) low-molecular components (e.g. oligomers), reaction residues (e.g. polymerization initiator) and the like; a step (Q) of introducing an acid-dissociating, dissolution-suppressing group into the terminal of copolymer obtained when polymerization has been made using a radical polymerization initiator (g); a step (S) of replacing the solvent used in previous step, with a solvent suitable for the next step or lithography; a step (T) of reducing the metal impurities undesirable in formation of semiconductor; and a step (U) of reducing the in-liquid particles (e.g. high-polymer and gel component) and substances causing development defects.

Step (P)

The step (P) is a step of radical-polymerizing at least a monomer corresponding to the recurring unit (A) and the like, in an organic solvent in the presence of the abovementioned radical polymerization initiator.

The use amount of the polymerization initiator can be determined depending upon the intended Mw of copolymer produced, the kinds of monomer, polymerization initiator, chain transfer agent and solvent, the proportion of each recurring unit, the temperature of polymerization, the rate of dropping, etc. The chain transfer agent can be used if necessary and it is preferably a thiol compound. The kind of the thiol compound can be selected widely from known thiol compounds; however, it is preferred to select a thiol compound having a structure wherein the hydrogen atom of hydroxyl group is substituted by an acid-labile, dissolution-suppressing group. The use amount of the chain transfer agent can be determined depending upon the intended Mw of copolymer produced, the kinds of monomer, polymerization initiator, chain transfer agent and solvent, the proportion of each recurring unit, the temperature of polymerization, the rate of dropping, etc.

As to the reaction solvent, there is no particular restriction as long as it is a compound capable of dissolving the monomer(s), the polymerization initiator, the chain transfer agent and the copolymer obtained by polymerization. As examples of such a solvent, there can be mentioned ketones such as acetone, methyl ethyl ketone, methyl isoamyl ketone, methyl amyl ketone, cyclohexanone and the like; esters such as methyl acetate, ethyl acetate, butyl acetate, methyl propionate, methyl 3-methoxypropionate, ethyl 3-ethoxypropionate, methyl lactate, ethyl lactate, γ-butyrolactone and the like; ethers such as tetrahydrofuran, dioxane, ethylene glycol dimethyl ether, diethylene glycol dimethyl ether and the like; ether esters such as ethylene glycol monomethyl ether acetate, ethylene glycol monoethyl ether acetate, ethylene glycol monobutyl ether acetate, propylene glycol monomethyl ether acetate, 3-methoxy-3-methyl-1-butyl acetate and the like; aromatic hydrocarbons such as toluene, xylene and the like; amides such as N,N-dimethylformamide, N-methylpyrrolidone and the like; dimethyl sulfoxide; and acetonitrile. They can be used singly or in admixture of two or more kinds.

As the method for specifically conducting the step (P), there can be mentioned, for example, (1) a simultaneous polymerization method wherein a monomer(s) and a polymerization initiator are dissolved in a solvent and the solution is heated to give rise to polymerization; (2) a dropping polymerization method wherein a monomer(s) and a polymerization initiator are dissolved in the same solvent if necessary and then dropped together into a heated solvent to give rise to polymerization; (3) an independent dropping polymerization method wherein a monomer(s) and a polymerization initiator are dissolved in solvents independently if necessary and then dropped independently into a heated solvent to give rise to polymerization; and (4) an initiator-dropping polymerization method wherein a monomer (s) is (are) dissolved in a solvent and heated, and a polymerization initiator separately dissolved in a solvent is dropped into the heated monomer(s) solution to give rise to polymerization. In the simultaneous polymerization method (1) and the initiator-dropping polymerization method (4), an unreacted monomer(s) contacts (contact) with a radical in a high monomer concentration state, in the polymerization system; and in the dropping polymerization method (2), the same phenomenon takes place in the storage tank of the mixture to be dropped into the polymerization system containing a heated solvent. Therefore, there is a high tendency of formation of a high-molecular compound (a high-polymer) having a molecular weight of 100,000 or more which is a cause for defect generation. In contrast, in the independent dropping polymerization method (3), a monomer(s) and a polymerization initiator are stored in respective tanks and, when they are dropped separately into the polymerization system, the unreacted monomer(s) is (are) kept at a low concentration; therefore, there is no formation of a high-polymer. Accordingly, the independent dropping polymerization method (3) is particularly preferred for production of the present copolymer. Incidentally, in the dropping polymerization method (2) and the independent dropping polymerization method (3), there may be changed, with the lapse of the dropping time, the proportion of each monomer dropped, the ratio of each monomer, polymerization initiator and chain transfer agent, etc.

The reaction temperature of the step (P) can be appropriately determined depending upon the boiling points of solvent, monomer(s), chain transfer agent, etc, the half-life temperature of polymerization initiator, etc. With a low temperature, polymerization does not proceed sufficiently, posing a problem in productivity; with an unnecessarily high temperature, there is a stability problem of monomer(s) and copolymer; therefore, the reaction temperature is selected in a range of preferably 40 to 120° C., particularly preferably 60 to 100° C.

With respect to the dropping times in the dropping polymerization method (2) and the independent dropping polymerization method (3), a short dropping time is not preferred because the molecular weight distribution of copolymer tends to be wide and the dropping of a large amount of solution at one time causes a decrease in the temperature of polymerization mixture; a long dropping time is not preferred because the copolymer produced undergoes a thermal history of more than required and the productivity is low. Therefore, the dropping time is selected in a range of ordinarily 30 minutes to 24 hours, preferably 1 to 12 hours, particularly preferably 2 to 8 hours.

After the completion of the dropping in the dropping polymerization method (2) and the independent dropping polymerization method (3), and after the temperature elevation to the polymerization temperature in the simultaneous polymerization method (1) and the initiator-dropping polymerization method (4), it is preferred that the system temperature is maintained for a given length of time, or further temperature elevation is made, to give rise to aging for reaction of yet unreacted monomer(s). Too long an aging time is not preferred because the productivity per hour is low and the copolymer produced undergoes a thermal history of more than required; therefore, the aging time is selected ordinarily within 12 hours, preferably within 6 hours, particularly preferably in a range of 1 to 4 hours.

Step (Q)

The step (Q) is a step of, when polymerization has been conducted using a radical polymerization initiator (g), modifying the carboxyl group of copolymer terminal to form a terminal structure (B). The step (Q) may be conducted successively to the step (P) or after the refining step (R) described later. The step (Q) is conducted, for example, by a step (Q1) of adding an enol ether to the carboxyl group of copolymer terminal, a step (Q2) of adding an olefin, a step (Q3) of adding an alkyl halide for dehydrohalogenation, and a step (Q4) of adding an alkyl halide ether for dehydrohalogenation. The step (Q1) is particularly preferred because it proceeds under relatively mild conditions and there is no need of using a metal-containing catalyst which is undesirable in semiconductor production. The step (Q1) is explained below.

The enol ether used in the step (Q1) can be presented by, for example, the following formula (H).

(H)

In the formula (H), $R_{81}$ and $R_{82}$ are each independently a hydrogen atom or a hydrocarbon group of 1 to 3 carbon atoms, specifically a hydrogen atom, a methyl group, an ethyl group, an n-propyl group or an isopropyl group. $R_{81}$ and $R_{82}$ may be bonded with each other to form a ring, specifically a cyclopentene ring, a cyclohexene ring or the like. $R_{83}$ is a hydrocarbon group of 1 to 15 carbon atoms which may contain oxygen atom, specifically a methyl group, an ethyl group, an n-propyl group, an isopropyl group, an n-butyl group, an isobutyl group, a tert-butyl group, a 2-ethylhexyl group, a cyclopentyl group, a cyclohexyl group, a norbornyl group, a tricyclo[5.2.1.0$^{2,6}$]decanyl group, an adamantyl group, a tetracyclo[4.4.0.1$^{2,5}$.1$^{7,10}$]dodecanyl group or the like. $R_{83}$ may be bonded with $R_{81}$ or $R_{82}$ to form a ring, specifically a hydrofuran ring, a hydropyran or the like. As $R_{83}$, there can also be mentioned a bifunctional enol ether containing alkenyloxy group.

As specific examples of the formula (H), there can be mentioned methyl vinyl ether, ethyl vinyl ether, n-propyl vinyl ether, isopropyl vinyl ether, n-butyl vinyl ether, isobutyl vinyl ether, tert-butyl vinyl ether, cyclopentyl vinyl ether, cyclohexyl vinyl ether, 8-tricyclo[5.2.1.0$^{2,6}$]decanyl vinyl ether, 1-adamantyl vinyl ether, 9-tetracyclo[4.4.0.1$^{2,5}$.1$^{7,10}$] dodecanyl vinyl ether, ethylene glycol divinyl ether, 1,4-butanediol divinyl ether, 1,4-cyclohexanedimethanol divinyl ether, 3(4),8(9)tricyclo[5.2.1.0$^{2,6}$]decanedimethanol divinyl ether, 1,3-adamantanediol divinyl ether, dihydrofuran and dihydropyran. However, the present invention is not restricted to these specific examples. These compounds can be used singly or in combination of two or more kinds.

For the step (Q1), a known method can be used with no restriction. Ordinarily, there is used, as the catalyst, an acid catalyst such as inorganic acid (e.g. hydrochloric acid, nitric acid or sulfuric acid), organic acid (e.g. p-toluenesulfonic acid or trifluoroacetic acid) or the like. As the reaction solvent, there is preferred a solvent which contains no hydroxyl group, is capable of dissolving the raw material copolymer and an enol ether to be added thereto, and is as stable as possible to the acid catalyst. As such a solvent, there can be mentioned ketones such as acetone, methyl ethyl ketone, methyl isoamyl ketone, methyl amyl ketone, cyclohexanone and the like; esters such as methyl acetate, ethyl acetate, butyl acetate, methyl propionate, methyl 3-methoxypropionate, ethyl 3-ethoxypropionate, γ-butyrolactone and the like; ethers such as tetrahydrofuran, dioxane, ethylene glycol dimethyl ether, diethylene glycol dimethyl ether and the like; ether esters such as ethylene glycol monomethyl ether acetate, ethylene glycol monoethyl ether acetate, ethylene glycol monobutyl ether acetate, propylene glycol monomethyl ether acetate, 3-methoxy-3-methyl-1-butyl acetate and the like; aromatic hydrocarbons such as toluene, xylene and the like; amides such as N,N-dimethylformamide, N-methylpyrrolidone and the like; dimethyl sulfoxide; and acetonitrile. These solvents can be used singly or in admixture of two or more kinds.

The reaction temperature of the step (Q1) is 0 to 80° C., preferably 5 to 70° C., particularly preferably 10 to 60° C. It is preferred that, prior to the reaction of the step (Q), the water content in the reaction system is reduced, for example, by treating the reaction system with a dehydrating agent such as sodium sulfate, magnesium sulfate, molecular sieve or the like, or by heating the reaction system if necessary and subjecting the reaction system to vacuum distillation to remove water together with more volatile components (e.g. solvent). This operation can be conducted as the step (S) described later, and the water content in the reaction system is preferably 0.5 mass % or less, more preferably 0.1 mass % or less, particularly preferably 0.05 mass % or less.

After addition of the enol ether, the acid catalyst is neutralized with a base if necessary and then can be extracted by contact with a polar solvent (e.g. water or alcohol), or can be removed by contact with an anion exchange resin. The anion exchange resin may be used by being mixed with a cation exchange resin, and the stage of extraction of the catalyst or its salt into solvent may be conducted as the step (R) described later.

Step (R)

The step (R) is a step for removing, using a solvent, unnecessary materials, contained in the copolymer obtained via the step (P), such as unreacted materials (e.g. unreacted monomer(s)), low-molecular components (e.g. oligomers), reaction residues (e.g. polymerization initiator) and the like. As the method for effecting the step (R), there can be mentioned, for example, (R1) a method of adding a poor solvent to precipitate the copolymer and then separating the solvent phase; (R1a) a method of, subsequently to the step (R1), adding a poor solvent to wash the copolymer and then separating the solvent phase; (R1b) a method of, subsequently to the step (R1), adding a good solvent to re-dissolve the copolymer, then adding a poor solvent to re-precipitate the copolymer, and then separating the solvent phase; (R2) a method of adding a poor solvent to form a poor solvent phase and a good solvent phase, and then separating the poor solvent phase; (R2a) a method of, subsequently to the step (R2), adding a poor solvent to wash the good solvent phase, and then separating the poor solvent phase. Incidentally, the step (R1a), the step (R1b) and the step (R2a) may be repeated, or may be combined.

As to the poor solvent, there is no particular restriction as long as the copolymer is sparingly soluble therein. There can be used, for example, water; alcohols such as methanol, isopropanol and the like; and saturated hydrocarbons such as hexane, heptane and the like. As to the good solvent, there is no particular restriction as long as the copolymer dissolves therein easily. There can be used one kind of good solvent or a mixture of two or more kinds of good solvents. The good solvent is preferably the same as the polymerization solvent for simpler production process. As examples of the good solvent, there can be mentioned the same solvents as mentioned for the reaction solvent of the step (P).

Step (S)

The step (S) is conducted when low-boiling impurities are contained in the solvent in which the copolymer is dissolved and the presence of these impurities in the next step or in lithography composition is undesirable, and is a step of distilling off, with heating under vacuum, the low-boiling impurities together with the solvent (in this case, the solvent is added if necessary), to remove the low-boiling impurities. When the solvent per se (in which the copolymer is dissolved) is undesirable as a solvent of the next step or of lithography composition, the step (S) is a step of adding, before or after the distilling-off of the solvent or in the course of the distilling-off, a solvent desirable as a solvent of the next step or of lithography composition to give rise to solvent replacement. The latter case can be conducted as the removal of low-boiling impurities.

The step (S) is conducted, for example, when the reaction solvent of the step (Q) is different from the reaction solvent of the step (P) or the good solvent of the step (R), or undesirable impurities (e.g. water) are present in the step (Q), or when the solvent of lithography composition is different from the solvent after the step (Q) or the step (R), or undesirable impurities are present in the lithography composition. The step (S) is preferred to be conducted prior to the step (Q) or the step (U) for preparation of lithography composition because, ordinarily, a different solvent is used in each step or undesirable impurities are contained in the step (Q) or the lithography composition.

It is possible to conduct removal of impurities or replacement of solvent without via the step (S), by conducting vacuum drying to obtain a solid and dissolving the solid in a different solvent. However, this approach is not preferred because it is difficult to obtain a solid completely free from impurities or solvent and the removal of impurities and solvent allows the copolymer (solid) to undergo a thermal history of more than required.

As to the temperature of the step (S), there is no particular restriction as long as the copolymer is not deteriorated at the temperature. However, the temperature is ordinarily preferred to be 100° C. or less, more preferred to be 80° C. or less, further preferred to be 70° C. or less, particularly preferred to be 60° C. or less. As to the amount of the solvent used for solvent replacement, too small an amount is not preferred because low-boiling compounds are not removed sufficiently; too large an amount is not preferred because a long time is needed for replacement and the copolymer undergoes a thermal history of more than required. The amount of the solvent for replacement can be selected in a range of ordinarily 1.05 to 10 times, preferably 1.1 to 5 times, particularly preferably 1.2 to 3 times the solvent amount required in final solution.

Step (T) (Metal Removal)

The step (T) is a step for removing metals which are undesirable in semiconductor lithography. This step is conducted, if necessary, because metals come into from the raw materials, subsidiary materials, equipment and environment used and the amounts thereof may exceed the limit allowed in semiconductor formation. Metals may be reduced in the step (R) in some degree when a poor solvent is used as the polar solvent in the step (R); in this case, therefore, the step (R) can be conducted as the step (T). As other methods of the step (T), there are, for example, a method of contacting a copolymer dissolved in an organic solvent with a cation exchange resin, preferably a mixed resin of a cation exchange resin and an anion exchange resin or acid adsorption resin; and a method of passing a copolymer dissolved in an organic solvent through a filter containing a substance having a positive zeta potential, such as polyamide polyamine epichlorohydrin cation resin. As the filter, there can be mentioned, for example, Zeta Plus 40 QSH, Zeta Plus 020 GN and Electropore EF (II) (all are products of Cuno K.K.).

The step (T) may be conducted by the step (R). Otherwise, the step (T) can be conducted before or after the individual steps other than the step (U) described later.

Step (U) (Microfiltration)

The step (U) is a step for passing a copolymer dissolved in an organic solvent, through a membrane filter to reduce in-solution particles (e.g. high-polymer and gel component) or substances causing development defects, which are undesirable in semiconductor lithography. The microfiltration of the filter is preferably 0.2 µm or less, more preferably 0.1 µm or less, particularly preferably 0.05 µm or less. As the material for the filter, there can be mentioned a polyolefin (e.g. polyethylene or polypropylene), a polar group-containing resin (e.g. polyamide, polyester or polyacrylonitrile), and a fluorine-containing resin (e.g. polyethylene fluoride). A polyamide is preferred particularly. As examples of the polyamide type filter, there can be mentioned Ultipleat P-Nylon 66 and Ultipore N 66 (products of Nihon Pall Ltd.), and Photoshield and Electropore (II) EF (products of Cuno K.K.). As the polyethylene type filter, there can be mentioned, for example, Microguard Plus HC 10 and Optimizer D (products of Nihon Microlyth). These filters can be used singly or in combination of two or more kinds.

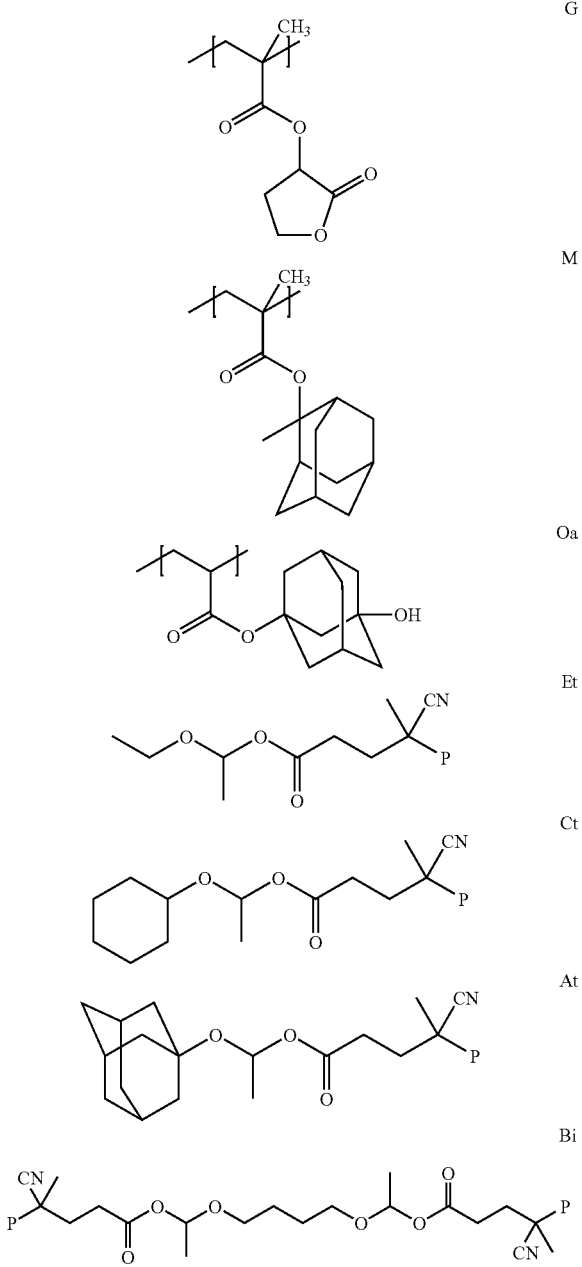

Step (V) (Resist Preparation)

The dried solid copolymer obtained thus can be made into a final resist composition by dissolving it in at least one kind of resist solvent, or diluting, if necessary, the copolymer dissolved in the resist solution, with the resist solvent, or adding other kind of resist solvent, and adding a radiation-sensitive, acid-generating agent (X) [hereinafter referred to as component (X)], an acid diffusion-suppressing agent (Y) (e.g. nitrogen-containing organic compound) for prevention of acid diffusion into the portion not exposed to radiation [this agent is hereinafter referred to as component (Y)] and, if necessary, other additives (Z) [hereinafter referred to as component (Z)].

The component (X) can be appropriately selected from those compounds heretofore proposed as a radiation-sensitive, acid-generating agent for chemically amplified type resist. As examples of such compounds, there can be mentioned an onium salt (e.g. iodonium salt or a sulfonium salt), an oxime sulfonate, a diazomethane (e.g. bisalkyl- or bisarylsulfonyldiazomethane), a nitrobenzylsulfonate, an iminosulfonate and a disulfone. Of these, an onium salt wherein a fluorinated alkylsulfonic acid ion is used as an anion, is preferred particularly. They may be used singly or in combination of two or more kinds. The component (X) is used in an amount of ordinarily 0.5 to 30 parts by mass, preferably 1 to 10 parts by mass relative to 100 parts by mass of the copolymer.

The component (Y) can be appropriately selected from those compounds heretofore proposed as an acid diffusion-suppressing agent for chemically amplified type resist. As examples of such compounds, there can be mentioned nitrogen-containing organic compounds. Primary to tertiary alkylamines or hydroxyalkylamines are preferred; tertiary alkylamines and tertiary hydroxyalkylamines are preferred particularly; and triethanolamine and triisopropanolamine are preferred most. They may be used singly or in combination of two or more kinds. The component (Y) is used in an amount of ordinarily 0.01 to 5.0 parts by mass relative to 100 parts by mass of the copolymer.

The resist solvent may be any solvent as long as it can dissolve the components constituting the resist composition and a uniform solution is obtained thereby. As the resist solvent, there can be freely selected from those solvents heretofore known as a solvent for chemically amplified type resist, and they can be used singly or as a mixed solvent of two or more kinds. Ordinarily, the resist solvent can be selected from those solvents mentioned as the reaction solvent of the step (P) and the good solvent of the step (R), in view of the solubility of components other than copolymer, viscosity of the resist composition, boiling point of the resist solvent, absorbance for radiation used in lithography, etc. Preferred resist solvents are methyl amyl ketone, cyclohexanone, ethyl lactate (EL), γ-butyrolactone and propylene glycol monomethyl ether acetate (PGMEA). A mixed solvent of PGMEA and other polar solvent is preferred particularly. As the polar solvent mixed with PGMEA, EL is preferred particularly.

As to the amount of the resist solvent contained in the resist composition, there is no particular restriction. However, the amount is ordinarily set appropriately so that there can be obtained a concentration enabling coating onto a substrate or the like and a viscosity suitable for the thickness of coating film. Generally, the resist solvent is used so that the solid content of resist composition becomes 2 to 20 mass %, preferably 5 to 15 mass %.

As other additives [component (Z)], there can be added, if necessary, compounds ordinarily used each as a resist additive, for example, an organic carboxylic acid or an oxo acid of phosphorus, for prevention of the deterioration of sensitivity of acid-generating agent and improvement in resist pattern shape, shelf life, etc.; an additional resin for improvement in resist film property; a surfactant for coatability improvement; a solubility suppressant; a plasticizer; a coloring agent; a halation-preventing agent; and a dye. As examples of the organic carboxylic acid, there can be mentioned malonic acid, citric acid, malic acid, succinic acid, benzoic acid and salicylic acid. They can be used singly or in admixture of two or more kinds. The organic carboxylic acid is used in an amount of 0.01 to 5.0 parts by mass relative to 100 parts by mass of the copolymer.

According to the present invention, there can be provided a copolymer for chemically amplified type positive lithography, which is superior in lithography properties (e.g. dissolution contrast); a radical polymerization initiator used for obtaining the copolymer; and a composition for semiconductor lithography, containing the copolymer. The reason therefor is not certain but is presumed to be as follows. That is, when the spatial secondary structure of copolymer in lithography thin film is considered, the terminal structure of copolymer, unlike the recurring unit(s), is unlikely to be hidden in the bending structure of main chain; therefore, the terminal structure has a large influence on the solubility of copolymer. In the present copolymer, the terminal structure, similarly to the recurring unit(s), has a structure which is greatly different in the solubility in developing solution before and after acid dissociation; therefore, the present copolymer is improved in properties such as dissolution contrast and the like.

Next, the present invention is described in more detail by way of Examples. However, the present invention is in no way restricted to these Examples. Incidentally, the abbreviations used in the following Examples have the following meanings.

Monomer G: γ-butyrolacton-2-yl methacrylate
Monomer M: 2-methyl-2-adamantyl methacrylate
Monomer Oa: 3-hydroxy-1-adamantyl acrylate
Polymerization initiator ACVA: 4,4'-azobis(4-cyanovaleric acid) [the compound (g4)]
Polymerization initiator MAIB: dimethyl 2,2'-azobisisobutyrate
Polymerization initiator Et: ethyl vinyl ether addition product of polymerization initiator ACVA [mixture of the compounds (G241a) and (G241b)]
Polymerization initiator Ct: cyclohexyl vinyl ether addition product of polymerization initiator ACVA (mixture of the compounds (G243a) and (G243b)]
Polymerization initiator At: 1-adamantyl vinyl ether addition product of polymerization initiator ACVA [mixture of the compounds (G244a) and (G244b)]
Polymerization initiator Bi: 1,4-butanediol divinyl ether addition product of polymerization initiator ACVA [the compound (G246a)]
Polymerization initiator Ti: 3(4),8(9)-tricyclo[5.2.1.0$^{2,6}$]-decanedimethanol divinyl ether addition product of polymerization initiator ACVA [the compound (G248a)]
G: recurring unit (D) derived from monomer G, the formula (D101)
M: recurring unit (A) derived from monomer M, the formula (A107)
Oa: recurring unit (E) derived from monomer Oa, the formula (E115)
Et: terminal structure (B) derived from polymerization initiator Et, the formula (B241)
Ct: terminal structure (B) derived from polymerization initiator Ct, the formula (B243)
At: terminal structure (B) derived from polymerization initiator At, the formula (B244)
Bi: terminal structure (B) derived from polymerization initiator Bi, the formula (B246)
Ti: terminal structure (B) derived from polymerization initiator Ti, the formula (B248)

(1) Measurements of Mw and Mw/Mn of copolymer (GPC)
Measured by GPC. The analytical conditions were as follows.
Apparatus: GPC 8220, a product of Tosoh Corporation
Detector: Differential refractive index (RI) detector
Column: KF-804 L, a product of Showa Denko K.K. (three columns)
Sample: About 0.1 g of a copolymer powder was dissolved in about 1 ml of tetrahydrofuran. The solution was used as a sample for measurement. 15 μl of the sample was poured into the GPC.

(2) Measurement of composition of recurring units and terminal of copolymer ($^{13}$C-NMR)
Apparatus: AV 300, a product of Bruker
Sample: There were mixed about 2 g of a 30 mass % copolymer solution, 0.1 g of Cr(acac)$_2$ and 1 g of deutrated acetone to obtain a uniform solution.
Measurement: A glass tube of 10 mm in inner diameter, temperature: 40° C., scanning: 8,000 times (3) Measurements of Eth, Rmax, tan θ
A resist film of 350 nm in thickness was formed with spin-coating a resist composition on a 4-inch silicon wafer, and prebaked (PAB) on a hot plate at 100° C. for 90 seconds. 18 square areas (10 mm×10 mm) of the film were exposed with various exposure amounts using an ArF excimer laser exposure system (VUVES-4500 produced by Lithotec Japan). Then, the resist film was post-baked at 120° C. for 90 seconds; developed with a 2.38 mass % aqueous tetramethylammonium hydroxide solution at 23° C.; and measured the thickness change over time during development at each exposure amount using a resist development analyzer (RDA-800, a product of Lithotech Japan).

Based on the date obtained above, there was prepared a discrimination curve (an alkali dissolution rate at each exposure amount) to determine the followings.

Eth (mJ/cm$^2$) which is an exposure energy required to make zero the resist film thickness.

Rmax (nm/sec) which is a film disappearing rate at Eth.

Rmin (nm/sec) which is a film disappearing rate at the rise of discrimination curve.

tan θ which is an slope of discrimination curve.

Example 1 Synthesis of Polymerization Initiator Et

In a glass container containing a stirrer were placed 2.0 g of a polymerization initiator ACVA (containing 13 mass % of water) and 40 g of methyl ethyl ketone (hereinafter referred to as MEK), and they were made into a suspension. Then, the suspension was kept at 10 kPa at 30° C. for 1 hour and then at 0.2 kPa at 30° C. for 20 minutes, and water and MEK were removed thoroughly. The weight of the remaining solid was 1.7 g. To the solid were added 10 g of MEK and 0.9 g of ethyl vinyl ether, and the mixture was made into a suspension. While the suspension was being heated at 30° C., 0.045 g of trifluoroacetic acid was added to the suspension. After 3

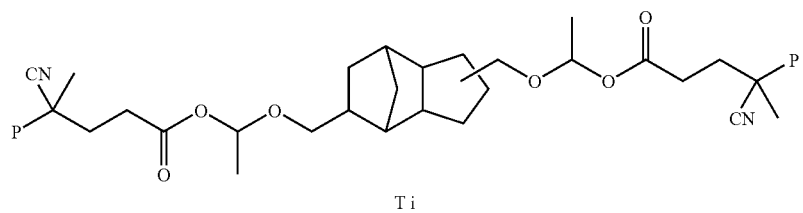

Ti hours, the solid in the liquid was dissolved completely and there was obtained an almost colorless, transparent liquid. Thereto was added a mixture of 0.045 g of triethylamine and 0.7 g of MEK to neutralize the acid. Then, the liquid mixture was transferred into a separating funnel and washed with 10 g of a deionized water, after which phase separation was made to obtain 10.8 g of an organic phase (an MEK solution).

To part of the organic phase was added DMSO-d$_6$, and $^{13}$C-NMR measurement was conducted. As a result, it was confirmed that 79% of the carboxylic acid of the polymerization initiator ACVA was changed to an acetal by ethyl vinyl ether and a polymerization initiator Et was formed.

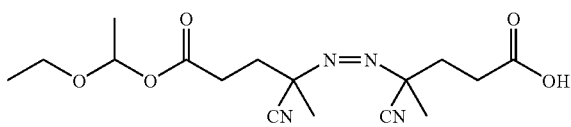

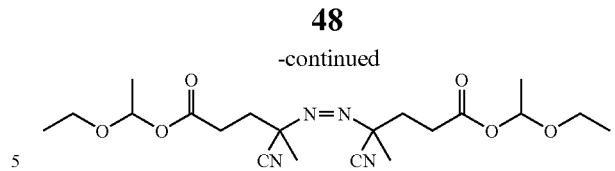

(a polymerization initiator Et)

Example 2 Synthesis of Polymerization Initiator Ct 11.6 g of an organic phase (an MEK solution) was obtained in the same manner as in Example 1 except that 1.6 g of cyclohexyl vinyl ether was used in place of the ethyl vinyl ether. To part of the organic phase was added DMSO-d$_6$, and $^{13}$C-NMR measurement was conducted. As a result, it was confirmed that 77% of the carboxylic acid of the polymerization initiator ACVA was changed to an acetal by cyclohexyl vinyl ether and a polymerization initiator Ct was formed.

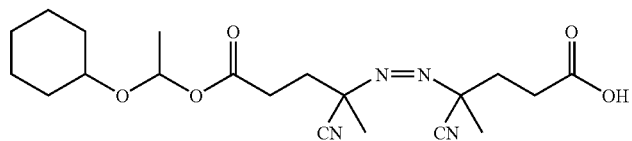

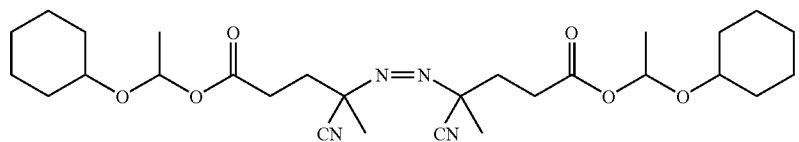

(a polymerization initiator Ct)

Example 3 Synthesis of Polymerization Initiator At 12.0 g of an organic phase (an MEK solution) was obtained in the same manner as in Example 1 except that 2.2 g of 1-adamantyl vinyl ether was used in place of the ethyl vinyl ether. To part of the organic phase was added DMSO-d$_6$, and $^{13}$C-NMR measurement was conducted. As a result, it was confirmed that 66% of the carboxylic acid of the polymerization initiator ACVA was changed to an acetal by 1-adamantyl vinyl ether and a polymerization initiator At was formed.

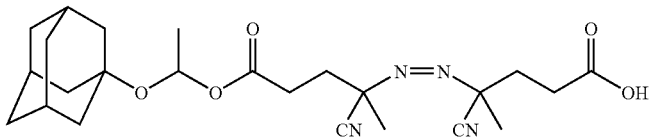

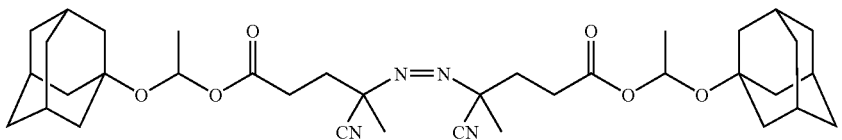

(a polymerization initiator At)

Example 4 Synthesis of Polymerization Initiator Bi 11.6 g of an organic phase (an MEK solution) was obtained in the same manner as in Example 1 except that 1.3 g of 1,4-butanediol divinyl ether was used in place of the ethyl vinyl ether. To part of the organic phase was added DMSO-$d_6$, and $^{13}$C-NMR measurement was conducted. As a result, it was confirmed that 85% of the carboxylic acid of the polymerization initiator ACVA was changed to an acetal by 1,4-butanediol divinyl ether and a polymerization initiator Bi was formed.

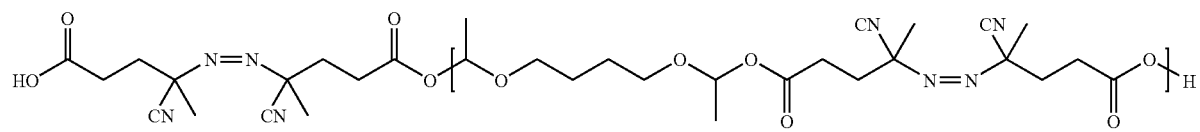

(a polymerization initiator Bi)

Example 5 Synthesis of Polymerization Initiator Ti 12.5 g of an organic phase (an MEK solution) was obtained in the same manner as in Example 1 except that 2.3 g of 3(4),8(9)-tricyclo[5.2.1.0$^{2,6}$]decanedimethanol divinyl ether was used in place of the ethyl vinyl ether. To part of the organic phase was added DMSO-$d_6$, and $^{13}$C-NMR measurement was conducted. As a result, it was confirmed that 83% of the carboxylic acid of the polymerization initiator ACVA was changed to an acetal by 3(4),8(9)tricyclo[5.2.1.0$^{2,6}$]decanedimethanol divinyl ether and a polymerization initiator Ti was formed.

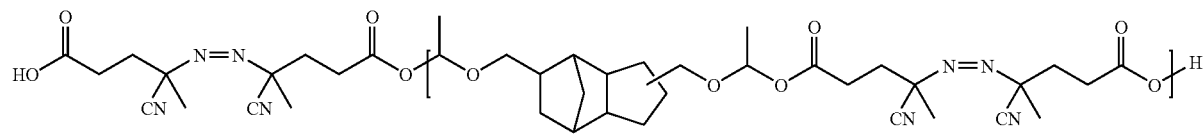

(a polymerization initiator Ti)

Example 6

In a container purged with nitrogen were placed 24.6 g of MEK, 10.3 g of a monomer M, 7.3 g of a monomer G, 5.1 g of a monomer Oa and 8.7 g of the polymerization initiator Et obtained in Example 1, to prepare a uniform "monomer feed solution". 18.9 g of MEK was placed in a reactor provided with a stirrer and a cooler. The reactor inside was purged with nitrogen and heated to 80° C. The monomer feed solution kept at about 25° C. was dropped into the reactor kept at 79 to 81° C., at a constant rate in 4 hours, using a metering pump. After the completion of the dropping, the reactor inside was kept at 80 to 81° C. for 2 hours, for aging. Then, the reactor was cooled to room temperature and the resulting polymer solution was taken out.

300 g of n-hexane was placed in a 1-liter container. The hexane was cooled to 15° C. with stirring and this condition was maintained. Thereto was dropped 75 g of the polymer solution to allow a copolymer to separate out. Stirring was continued for a further 30 minutes, after which filtration was conducted to obtain a wet cake. The wet cake was returned to the container. Thereto was added 300 g of a mixed solvent of n-hexane and MEK; stirring was conducted for 30 minutes for washing; and filtration was conducted. This washing of wet cake was conducted once more. The resulting wet cake was vacuum-dried at 60° C. or below for 8 hours to obtain a white copolymer powder. The copolymer was analyzed for composition of recurring units and terminal structure by $^{13}$C-NMR, as well as for Mw (mass-average molecular weight) and Mw/Mn (molecular weight distribution) by GPC. The analysis results are shown in Table 1.

Then, 100 parts by weight of the copolymer obtained above was mixed with the following additives and solvent of the following amounts, to prepare a resist composition.
(1) Component (X): 4-methylphenyldiphenylsulfonium nonafluorobutanesulfonate, 3.5 parts by weight
(2) Component (Y): triethanolamine, 0.2 part by weight
(3) Component (Z): Surflon S-381 (a product of Seimi Chemical Co., Ltd.), 0.1 part by weight
(4) Mixed solvent consisting of 450 parts by mass of PGMEA and 300 parts by mass of ethyl lactate (hereinafter referred to as "EL")

The resist composition was measured for Eth, Rmax and tan θ. The results are shown in Table 1.

Example 7

A white copolymer powder was obtained in the same manner as in Example 6 except that the polymerization initiator Et solution obtained in Example 1 was replaced by 10.0 g of the polymerization initiator Ct solution obtained in Example 2. The copolymer was analyzed for composition of recurring units and terminal structure by $^{13}$C-NMR, as well as for Mw (mass-average molecular weight) and Mw/Mn (molecular weight distribution) by GPC. The analysis results are shown in Table 1. A resist composition was prepared in the same manner as in Example 6 and measured for Eth, Rmax and tan θ. The results are shown in Table 1.

Example 8

A white copolymer powder was obtained in the same manner as in Example 6 except that the polymerization initiator Et solution obtained in Example 1 was replaced by 10.9 g of the polymerization initiator At solution obtained in Example 3. The copolymer was analyzed for composition of recurring units and terminal structure by $^{13}$C-NMR, as well as for Mw (mass-average molecular weight) and Mw/Mn (molecular weight distribution) by GPC. The analysis results are shown in Table 1. A resist composition was prepared in the same manner as in Example 6 and measured for Eth, Rmax and tan θ. The results are shown in Table 1.

Example 9

A white copolymer powder was obtained in the same manner as in Example 6 except that the polymerization initiator Et solution obtained in Example 1 was replaced by 10.5 g of the polymerization initiator Bi solution obtained in Example 4. The copolymer was analyzed for composition of recurring units and terminal structure by $^{13}$C-NMR, as well as for Mw Comparative Example 2

A white copolymer powder was obtained in the same manner as in Example 6 except that the polymerization initiator Et solution obtained in Example 1 was replaced by 1.0 g of a polymerization initiator MAIB. The copolymer was analyzed for composition of recurring units and terminal structure by $^{13}$C-NMR, as well as for Mw (mass-average molecular weight) and Mw/Mn (molecular weight distribution) by GPC. The analysis results are shown in Table 1. A resist composition was prepared in the same manner as in Example 6 and measured for Eth, Rmax and tan θ. The results are shown in Table 1.

TABLE 1

|  | NMR | | | | | | | | GPC | | Eth | Rmax | |
| --- | --- | --- | --- | --- | --- | --- | --- | --- | --- | --- | --- | --- | --- |
|  | G | M | Oa | Et | Ct | At | Bi | Ti | Mw | Mw/Mn | mJ/cm² | nm/sec | tan θ |
| Ex. 6 | 40.0 | 39.6 | 20.4 | 4.5 | | | | | 7,740 | 1.92 | 15.5 | 2,290 | 5.5 |
| Ex. 7 | 40.8 | 39.3 | 19.9 | | 5.0 | | | | 7,510 | 1.85 | 12.9 | 2,180 | 6.3 |
| Ex. 8 | 40.7 | 39.0 | 20.3 | | | 3.9 | | | 7,210 | 1.87 | 12.6 | 2,360 | 6.5 |
| Ex. 9 | 40.5 | 39.2 | 20.3 | | | | 5.5 | | 7,290 | 1.71 | 13.5 | 2,890 | 6.9 |
| Ex. 10 | 41.0 | 39.0 | 20.0 | | | | | 5.4 | 7,350 | 1.73 | 12.3 | 3,030 | 7.1 |
| Comp. Ex. 1 | 42.5 | 36.6 | 20.9 | | | | | | 3,380 | 1.61 | 5.5 | 430 | 4.2 |
| Comp. Ex. 2 | 41.5 | 39.0 | 19.5 | | | | | | 10,650 | 1.71 | 2.7 | 660 | 4.4 |

(mass-average molecular weight) and Mw/Mn (molecular weight distribution) by GPC. The analysis results are shown in Table 1. A resist composition was prepared in the same manner as in Example 6 and measured for Eth, Rmax and tan θ. The results are shown in Table 1.

Example 10

A white copolymer powder was obtained in the same manner as in Example 6 except that the polymerization initiator Et solution obtained in Example 1 was replaced by 10.8 g of the polymerization initiator Ti solution obtained in Example 5. The copolymer was analyzed for composition of recurring units and terminal structure by $^{13}$C-NMR, as well as for Mw (mass-average molecular weight) and Mw/Mn (molecular weight distribution) by GPC. The analysis results are shown in Table 1. A resist composition was prepared in the same manner as in Example 6 and measured for Eth, Rmax and tan θ. The results are shown in Table 1.

Comparative Example 1

A white copolymer powder was obtained in the same manner as in Example 6 except that the polymerization initiator Et solution obtained in Example 1 was replaced by 3.5 g of a polymerization initiator MAIB. The copolymer was analyzed for composition of recurring units and terminal structure by $^{13}$C-NMR, as well as for Mw (mass-average molecular weight) and Mw/Mn (molecular weight distribution) by GPC. The analysis results are shown in Table 1. A resist composition was prepared in the same manner as in Example 6 and measured for Eth, Rmax and tan θ. The results are shown in Table 1.

As indicated by the above results of Examples and Comparative Examples, the lithography composition containing the copolymer of the present invention is clearly superior to conventional techniques, in Rmax and tan θ.

INDUSTRIAL APPLICABILITY

According to the present invention there can be provided a copolymer which can be used in chemically amplified positive type lithography and is superior in lithography properties such as dissolution contrast and the like; a radical polymerization initiator used in production of the copolymer; and a composition for lithography, containing the copolymer.

What is claimed is:

1. A method for production of a copolymer for positive type lithography, from a monomer capable of giving a recurring unit represented by the formula (A)

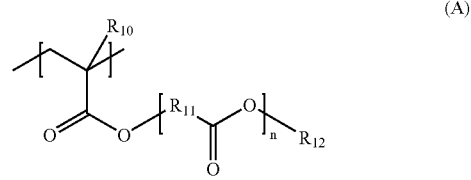

(A)

in the formula (A), $R_{10}$ is a hydrogen atom or a hydrocarbon group of 1 to 4 carbon atoms which may be substituted by fluorine atom; $R_{11}$ is a crosslinked, alicyclic hydrocarbon group of 7 to 12 carbon atoms, crosslinked by a hydrocarbon group of 1 to 2 carbon atom, an oxygen atom or a sulfur atom; n is an integer of 0 or 1; and $R_{12}$ is an acid-dissociating, dissolution-suppressing group, wherein said method comprises:

radical polymerizing the recurring unit (A) in the presence of a radical polymerization initiator represented by the formula (G)

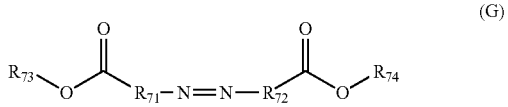

in the formula (G), $R_{71}$ and $R_{72}$ are each a hydrocarbon group of 3 to 6 carbon atoms which may contain nitrogen atom; $R_{73}$ and $R_{74}$ are each a hydrogen atom or an acid-dissociating, dissolution-suppressing group; and at least one of $R_{73}$ and $R_{74}$ is an acid-dissociating, dissolution-suppressing group;

and introducing a terminal structure (B) having a structure wherein an alkali-soluble group is protected by an acid-dissociating, dissolution-suppressing group by radical polymerization in the presence of said radical polymerization initiator (G), wherein said terminal structure is represented by the following formula (B)

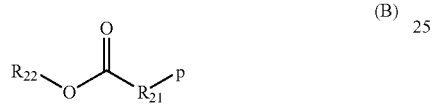

in the formula (B), $R_{21}$ is a hydrocarbon group of 3 to 6 carbon atoms which may contain nitrogen atom; $R_{22}$ is an acid-dissociating, dissolution-suppressing group; and p is a site of bonding with copolymer main chain.

2. The method for production of said copolymer for positive type lithography, according to claim 1, wherein the acid-dissociating, dissolution-suppressing group $R_{12}$ in the formula (A) is selected from a structure represented by the following formula (C1)

in the formula (C1), o is a bonding site of $R_{12}$; $R_{31}$ and $R_{32}$ are each independently a hydrocarbon group of 1 to 4 carbon atoms; $R_{33}$ is a hydrocarbon group of 1 to 12 carbon atoms; and $R_{33}$ may be bonded with $R_{31}$ or $R_{32}$ to form a ring and a structure represented by the following formula (C2)

in the formula (C2), o is a bonding site of $R_{12}$; $R_{34}$ and $R_{35}$ are each independently a hydrogen atom or a hydrocarbon group of 1 to 4 carbon atoms; $R_{36}$ is a hydrocarbon group of 1 to 12 carbon atoms; and $R_{34}$ may be bonded with $R_{35}$ or $R_{36}$ to form a ring.

3. The method for production of said copolymer for positive type lithography, according to claim 1, wherein the acid-dissociating, dissolution-suppressing group $R_{22}$ in the formula (B) is a structure represented by the following formula (C3)

in the formula (C3), o is a bonding site of $R_{22}$; $R_{37}$ and $R_{38}$ are each independently a hydrogen atom or a hydrocarbon group of 1 to 4 carbon atoms; $R_{39}$ is a hydrocarbon group of 1 to 12 carbon atoms; $R_{37}$ may be bonded with $R_{38}$ or $R_{39}$ to form a ring; and $R_{39}$ may be bonded with the terminal structure (B).

4. The method for production of said copolymer for positive type lithography, according to claim 1, which contains a recurring unit (D) having a lactone structure represented by the following formula (D)

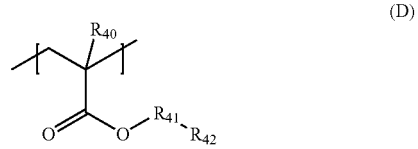

in the formula (D), $R_{40}$ is a hydrogen atom, or a hydrocarbon group of 1 to 4 carbon atoms which may be substituted by fluorine atom; $R_{41}$ is a single bond, or an alicyclic hydrocarbon group of 5 to 12 carbon atoms which may be crosslinked via hydrocarbon group of 1 to 2 carbon atoms, an oxygen atom or a sulfur atom; $R_{42}$ is a lactone structure represented by the following formula (L)

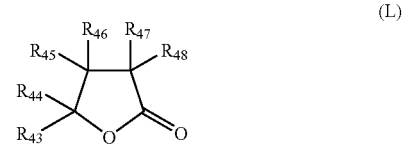

in the formula (L), any one of the two of $R_{43}$ to $R_{48}$ are each a single bond bonding with $R_{41}$ in the formula (D) and the remainder is a hydrogen atom or a hydrocarbon group or alkoxy group of 1 to 4 carbon atoms; and $R_{42}$ is bonded with $R_{41}$ via one or two single bonds.

5. The method for production of said copolymer for positive type lithography, according to claim 1, which contains a recurring unit (E) having hydroxyl group.

6. The method for production of said copolymer for positive type lithography, according to claim 5, wherein the recurring unit (E) having hydroxyl group is a recurring unit (E11) having hydroxyl group-substituted adamantyl group, represented by the following formula (E11)

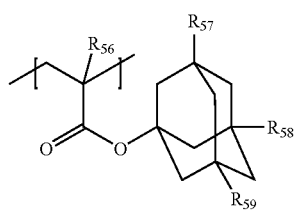
(E11)
in the formula (E11), $R_{56}$ is a hydrogen atom, or a hydrocarbon group of 1 to 4 carbon atoms which may be substituted by fluorine atom; $R_{57}$ to $R_{59}$ are each independently a hydrogen atom or hydroxyl group; and at least one of $R_{57}$ to $R_{59}$ is a hydroxyl group.
* * * * *